(12) United States Patent
Yu

(10) Patent No.: US 10,887,961 B2
(45) Date of Patent: Jan. 5, 2021

(54) WATERPROOF, DUAL-POLARITY DECORATIVE LIGHT STRING

(71) Applicant: Ledup Manufacturing Group Limited, Irwindale, CA (US)

(72) Inventor: Jing Jing Yu, Irwindale, CA (US)

(73) Assignee: Ledup Manufacturing Group Limited, Irwindale, CA (US)

( * ) Notice: Subject to any disclaimer, the term of this patent is extended or adjusted under 35 U.S.C. 154(b) by 0 days.

(21) Appl. No.: 16/396,382

(22) Filed: Apr. 26, 2019

(65) Prior Publication Data

US 2019/0341718 A1 Nov. 7, 2019

Related U.S. Application Data

(60) Provisional application No. 62/665,360, filed on May 1, 2018, provisional application No. 62/675,015, filed
(Continued)

(51) Int. Cl.
*H05B 45/20* (2020.01)
*F21S 4/10* (2016.01)
(Continued)

(52) U.S. Cl.
CPC ............ *H05B 45/20* (2020.01); *F21K 9/232* (2016.08); *F21K 9/238* (2016.08); *F21K 9/66* (2016.08); *F21S 4/00* (2013.01); *F21S 4/10* (2016.01); *F21S 4/15* (2016.01); *F21V 3/062* (2018.02); *F21V 17/002* (2013.01); *F21V 17/06* (2013.01); *F21V 19/004* (2013.01); *F21V 21/002* (2013.01); *F21V 21/096* (2013.01); *F21V 23/001* (2013.01); *F21V 23/02* (2013.01); *F21V 23/06* (2013.01); *F21V 31/005* (2013.01); *H01R 12/714* (2013.01); *H01R 13/5202* (2013.01); *H01R 13/5205* (2013.01);
(Continued)

(58) Field of Classification Search
CPC ....... F21S 4/00; F21S 4/10; F21S 4/15; F21V 21/002; F21V 23/005; F21V 19/003; F21Y 2107/90
See application file for complete search history.

(56) References Cited

U.S. PATENT DOCUMENTS 5,649,763 A * 7/1997 Liou .................... F21V 19/0005
362/363
6,079,848 A * 6/2000 Ahroni .................... H01R 4/242
362/249.01

(Continued)

FOREIGN PATENT DOCUMENTS

DE 29614510 U1 * 10/1996 .............. F21V 31/00
EP 1384942 A1 * 1/2004 ............. H01R 33/09
WO WO-2018101006 A1 * 6/2018 ................ F21S 4/10

*Primary Examiner* — Alexander K Garlen
*Assistant Examiner* — Colin J Cattanach
(74) *Attorney, Agent, or Firm* — Cochran Freund & Young LLC; William W. Cochran

(57) ABSTRACT

Disclosed is a waterproof LED light string that provides outdoor lighting in a simple and reliable manner. Waterproof bulb assemblies are used with replaceable LED light sources. The bulb assemblies are easily suspended from a rope or wire, screwed to a support, or magnetically supported from a ferrous metal support. Duplicate circuitry in the LED light source allows the LED light source to be connected in either direction.

12 Claims, 29 Drawing Sheets

Related U.S. Application Data on May 22, 2018, provisional application No. 62/718,835, filed on Aug. 14, 2018.

(51) Int. Cl.

| | |
|---|---|
| *F21V 3/06* | (2018.01) |
| *F21V 17/06* | (2006.01) |
| *F21V 21/096* | (2006.01) |
| *F21V 23/00* | (2015.01) |
| *F21V 23/02* | (2006.01) |
| *F21V 23/06* | (2006.01) |
| *F21V 31/00* | (2006.01) |
| *H01R 12/71* | (2011.01) |
| *H01R 13/52* | (2006.01) |
| *H01R 33/18* | (2006.01) |
| *H01R 33/88* | (2006.01) |
| *H01R 43/00* | (2006.01) |
| *H01R 43/20* | (2006.01) |
| *H05K 1/11* | (2006.01) |
| *H05K 1/18* | (2006.01) |
| *F21K 9/66* | (2016.01) |
| *F21K 9/238* | (2016.01) |
| *F21K 9/232* | (2016.01) |
| *F21V 17/00* | (2006.01) |
| *F21V 19/00* | (2006.01) |
| *H05B 45/40* | (2020.01) |
| *F21S 4/15* | (2016.01) |
| *F21V 21/002* | (2006.01) |
| *F21S 4/00* | (2016.01) |
| *F21Y 115/10* | (2016.01) |

(52) U.S. Cl.
CPC ............ *H01R 33/18* (2013.01); *H01R 33/88* (2013.01); *H01R 43/005* (2013.01); *H01R 43/20* (2013.01); *H05B 45/40* (2020.01); *H05K 1/117* (2013.01); *H05K 1/181* (2013.01); *F21Y 2115/10* (2016.08); *H05K 2201/10106* (2013.01); *H05K 2201/10545* (2013.01)

(56) References Cited

U.S. PATENT DOCUMENTS

| | | | | |
|---|---|---|---|---|
| 7,784,993 | B2 * | 8/2010 | Yu | H05B 45/50 362/657 |
| 2009/0294782 | A1 * | 12/2009 | Peng | F21V 19/0025 257/89 |
| 2010/0073963 | A1 * | 3/2010 | Yu | F21S 4/10 362/653 |
| 2011/0050081 | A1 * | 3/2011 | Lin | F21S 4/10 313/318.01 |
| 2012/0033407 | A1 * | 2/2012 | Barta | F21V 23/005 362/95 |
| 2015/0062929 | A1 * | 3/2015 | Mostoller | F21K 9/235 362/363 |
| 2015/0204524 | A1 * | 7/2015 | Pan | F21V 19/0025 313/318.01 |
| 2017/0336063 | A1 * | 11/2017 | Leung | F21V 3/00 |
| 2018/0202613 | A1 * | 7/2018 | Liaw | F21K 9/20 |
| 2018/0372278 | A1 * | 12/2018 | Zhang | F21K 9/237 |

* cited by examiner

WATERPROOF, DUAL-POLARITY DECORATIVE LIGHT STRING

CROSS-REFERENCE TO RELATED APPLICATION

This Non-Provisional patent application claims the benefit of the U.S. Provisional Patent Application No. 62/665,360, entitled "Individually Accessible Led Light System," which was filed with the U.S. Patent & Trademark Office on May 1, 2018, the U.S. Provisional Patent Application No. 62/675,015, entitled "A Surface Mounted and Chip On Board, High Brightness Led Replaceable Lighting System," filed on May 22, 2018, and U.S. Provisional Patent Application No. 62/718,835, entitled "Waterproof, Dual-Polarity Decorative Light String," filed on Aug. 14, 2018, all of which are specifically incorporated herein by reference for all that they disclose and teach.

BACKGROUND OF THE INVENTION

Outdoor decorative light strings have become more popular and are frequently used in outdoor settings such as parties, restaurants, outdoor bars and other outdoor venues. In addition, outdoor decorative lights, such as yard lights, can be used to illuminate lawns and gardens and provide an aesthetic and pleasing atmosphere, which can be enjoyed year-round.

SUMMARY OF THE INVENTION

An embodiment of the present invention may therefore comprise an LED light string for illuminating an outdoor area that is waterproof and resistant to corrosion comprising: a pair of wires that carry an alternating current signal; a plastic socket housing that surrounds a portion of the pair of wires; socket housing boots made from plastic that provide a water tight seal between the pair of wires and the socket housing; a first housing terminal that is electrically connected to a first wire of the pair of wires and having a first tab that protrudes from a surface of the first housing terminal; a second housing terminal that is electrically connected to a second wire of the pair of wires and having a second tab that protrudes from a surface of the second housing terminal; a plastic terminal holder that is secured to the socket housing to create a water tight seal between the terminal holder and the socket housing, the terminal holder having first openings which hold the first housing terminal and the second housing terminal securely in the terminal holder, and a second opening, adjacent to the first openings that forms a slot in the terminal holder adjacent to the first housing terminal and the second housing terminal so that the first tab on the first housing terminal and the second tab on the second housing terminal extend into the slot; an LED light source having a first light source terminal, a first electronics pack and a first LED emitter having at least one LED, the first light source terminal, the first electronics pack and the first LED emitter located on a first side of the LED light source, and a second light source terminal, a second electronics pack and a second LED emitter having at least one LED, the second light source terminal, the second electronics pack and the second LED emitter located on a second side of the LED light source, the LED light source having a terminal base between the first light source terminal and the second light source terminal that fits in the slot in the terminal holder so that the first tab of the first housing terminal contacts the first light source terminal and the second tab on the second housing terminal contacts the second light source terminal when the terminal base is disposed in the slot in the terminal holder.

An embodiment of the present invention may further comprise a method of making an LED light string for illuminating an outdoor area that is waterproof and resistant to corrosion comprising: providing a molded bulb shell having a collar portion; providing a molded bulb shell cap having a surface that fits over the collar portion of the bulb shell and forms a water tight seal; providing a molded plastic socket housing having at least one mounting flange, pivot holes for mounting a shaft and hook for suspending the LED light string from a wire, two openings for passing an electrical cable through the socket housing, and a magnet mount for mounting a magnet; providing a molded plastic terminal holder having plastic threads on an exterior surface and at least two terminal openings and a slot opening adjacent to the at least two terminal openings; attaching at least two housing terminals to the electrical cable that extend through the at least two terminal openings in the plastic terminal holder; attaching the plastic terminal holder to the plastic socket housing to form a waterproof seal between the plastic terminal holder and the plastic socket housing; attaching the shaft and hook to the plastic socket housing; attaching a magnet to the magnet mount in the plastic terminal holder; providing an LED light source having duplicate circuitry comprising two LED emitters on opposite sides of the LED light source, two electronics packs on opposite sides of the LED light source that control illumination of the two LED emitters, and two light source terminals on opposite sides of the LED light source that provide power to the two electronics packs from the electrical cable allowing the LED light source to be inserted into the slot in the plastic terminal holder in either direction so that one side of the LED light source is illuminated as a result of the duplicate circuitry.

DETAILED DESCRIPTION OF THE EMBODIMENTS

Figure 1:
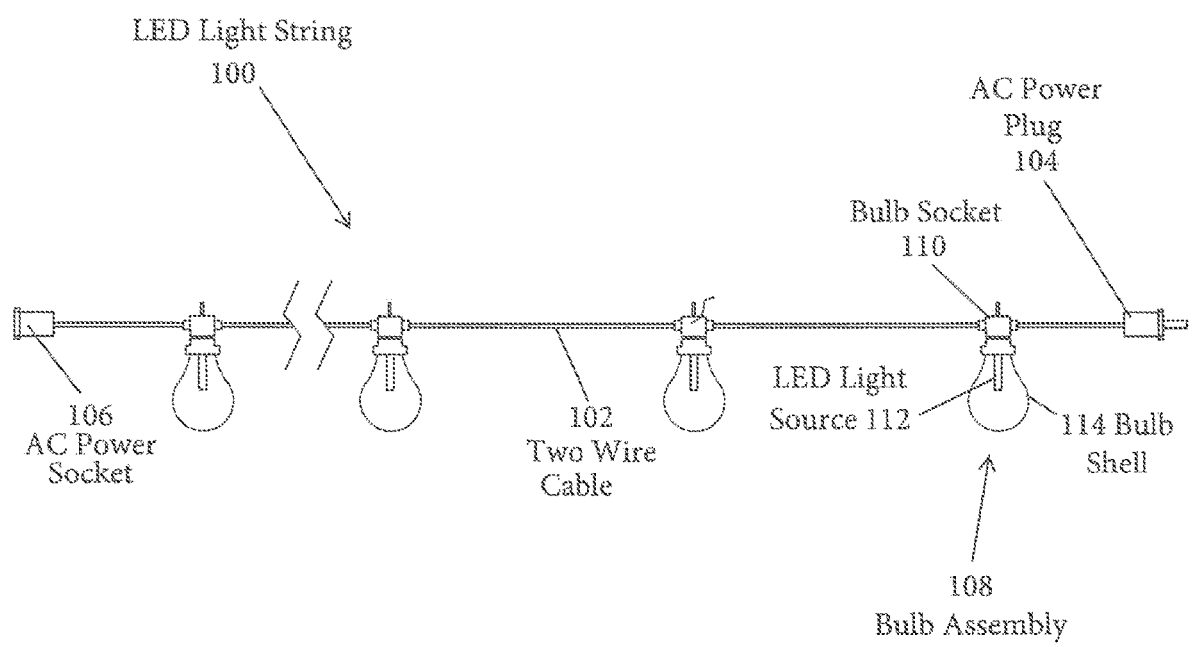
FIG. 1 is a schematic side view of an LED light string.

FIG. 1 is a schematic side view of a decorative LED light assembly that can be used in an outdoor setting in various venues. Outdoor lighting has been used for various purposes to create an aesthetic outdoor atmosphere. Both personal and commercial application of outdoor lighting has been used extensively. One of the problems encountered in outdoor lighting is that standard incandescent bulbs and compact fluorescent bulbs having standard metal screw-in fixtures have been used, which rust easily, especially in environments near salt water. Typical outdoor light strings, include a metal screw-in base that is not waterproof. Although LED bulbs can be used rather than standard incandescent or compact fluorescent bulbs, in order to increase longevity and decrease the cost of use, the same problem exists which is the corrosion of the screw connectors in both the bulb holder and on the bulb. Water from sprinkler systems, rainfall, sea spray and other sources can cause corrosion. Air born salts contained near bodies of salt water are especially corrosive. The use of high illumination LED light strings has replaced some of the non-waterproof conventional outdoor light strings. However, such light strings require AC to DC converters and do not provide the output power and illumination desired by many users.

Most LED light sources have a polarized socket, which requires installation of the LED light source in a particular direction in order for the light source to operate. This is particularly true when a DC supply is provided. AC supplies, especially 117-volt RMS supplies, are more convenient and more readily accessible for outdoor lighting. The presently claimed invention provides a waterproof plastic enclosure for a high illumination LED light source that does not require a specified polarity. The light source is replaceable and can be inserted in the bulb socket 110 in either of two directions. Bulb shells are provided with threaded plastic connectors, which are not subject to rust.

As illustrated in FIG. 1, the LED light string 100 has a two wire cable 102 that is capable of carrying 117-volt RMS electrical power. The two wire cable 102 is connected to an AC power plug 104 and, optionally, an AC power socket 106. The LED light string 100 has a number of bulb assemblies, such as bulb assembly 108, having an LED light source 112 and a bulb shell 114 which fits into a bulb socket 110. The LED light string 100 is strung in an outdoor location to provide decorative lighting.

Figure 2:
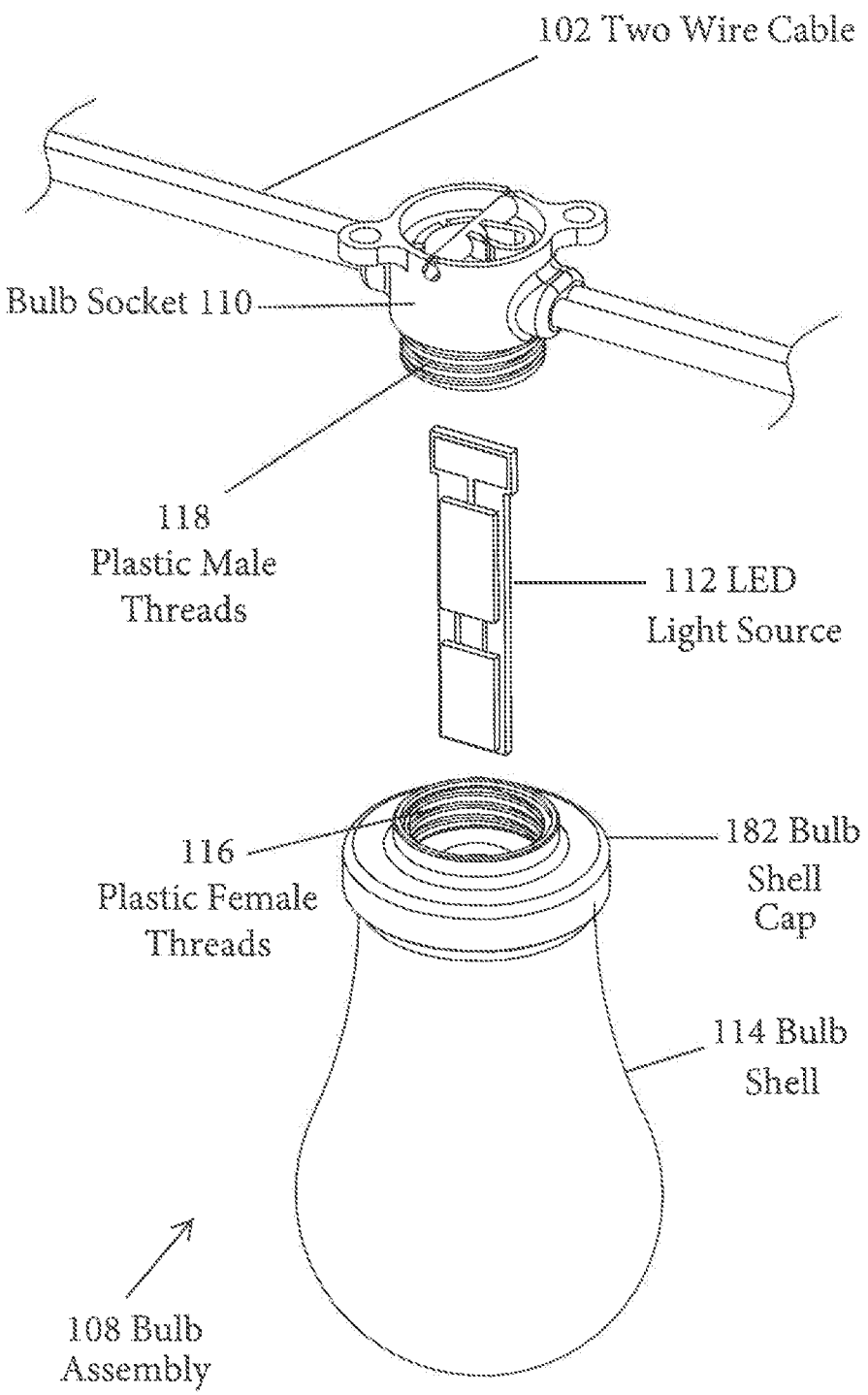
FIG. 2 is an exploded diagram of one of the lights of the LED light string.

FIG. 2 is an exploded view of a bulb assembly 108. As illustrated in FIG. 2, the two wire cable 102 provides power to the bulb socket 110. The bulb socket 110 is connected to a terminal holder 122 (FIG. 3) that has plastic male threads 118. The LED light source 112 connects to the terminal holder 122 (FIG. 3) and provides a source of LED light. A bulb shell cap 182 is connected through a waterproof joint to a bulb shell 114. The bulb shell cap 182 has plastic female threads 116 that thread together with the plastic male threads 118 to create a waterproof connection.

Figure 3:
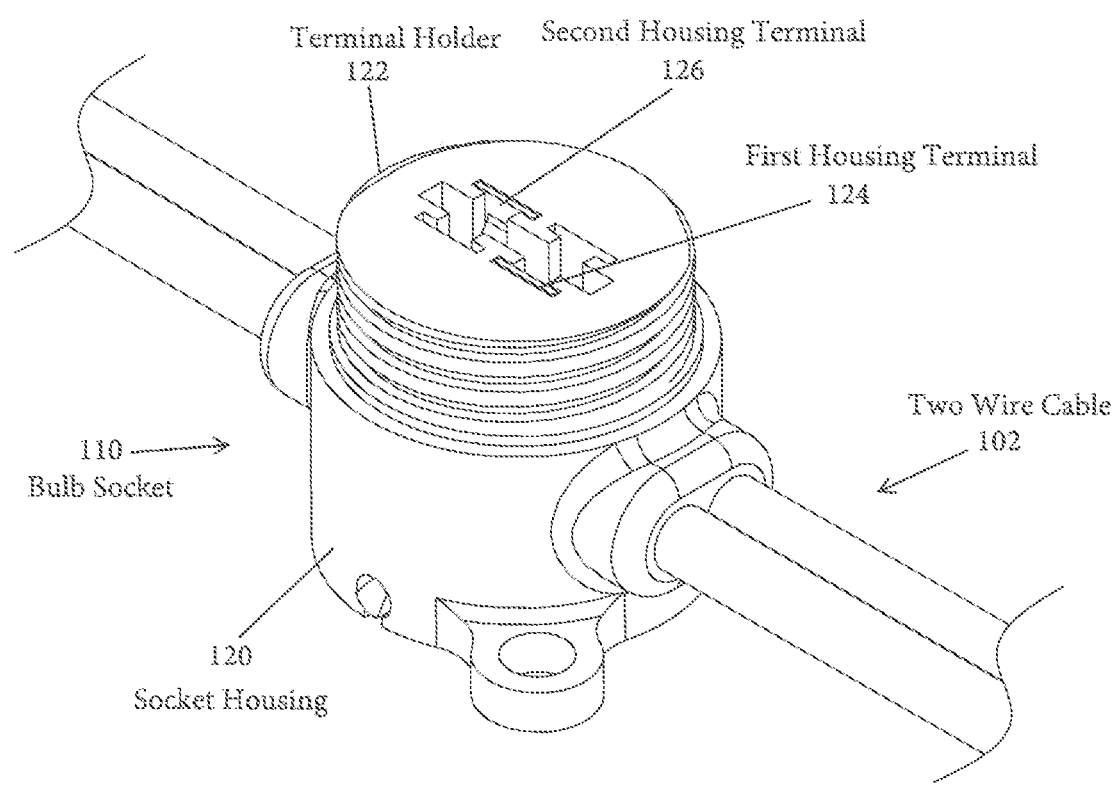
FIG. 3 is a bottom view of a bulb socket of one of the lights of the LED light string.

FIG. 3 is an isometric bottom view of the bulb socket 110 illustrating the socket housing 120 and terminal holder 122. The terminal holder 122 is tightly fit into the socket housing 120 and a watertight seal is created between the terminal holder 122 and socket housing 120. A bonding material or heat fusion may assist in securing the terminal holder 122 to the socket housing 120. The two wire cable 102 passes through the socket housing 120 and the terminal holder 122. FIG. 3 illustrates a first housing terminal 124 and a second housing terminal 126, which are attached to separate wires of the two wire cable 102.

Figure 4:
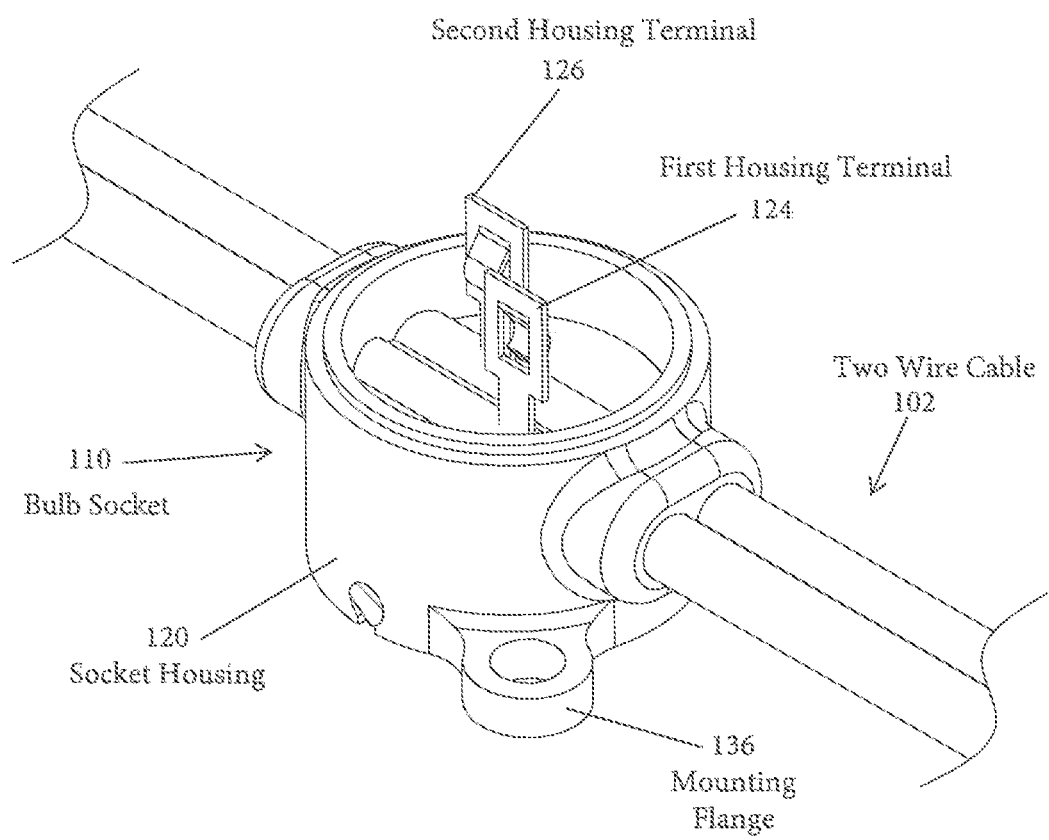
FIG. 4 is a bottom partial view of a bulb socket.

FIG. 4 is an isometric view of the bulb socket 110 illustrating the first housing terminal 124 and the second housing terminal 126 attached to separate wires of the two wire cable 102 that passes through the socket housing 120. A mounting flange 136 is mounted to the socket housing 120.

Figure 5:
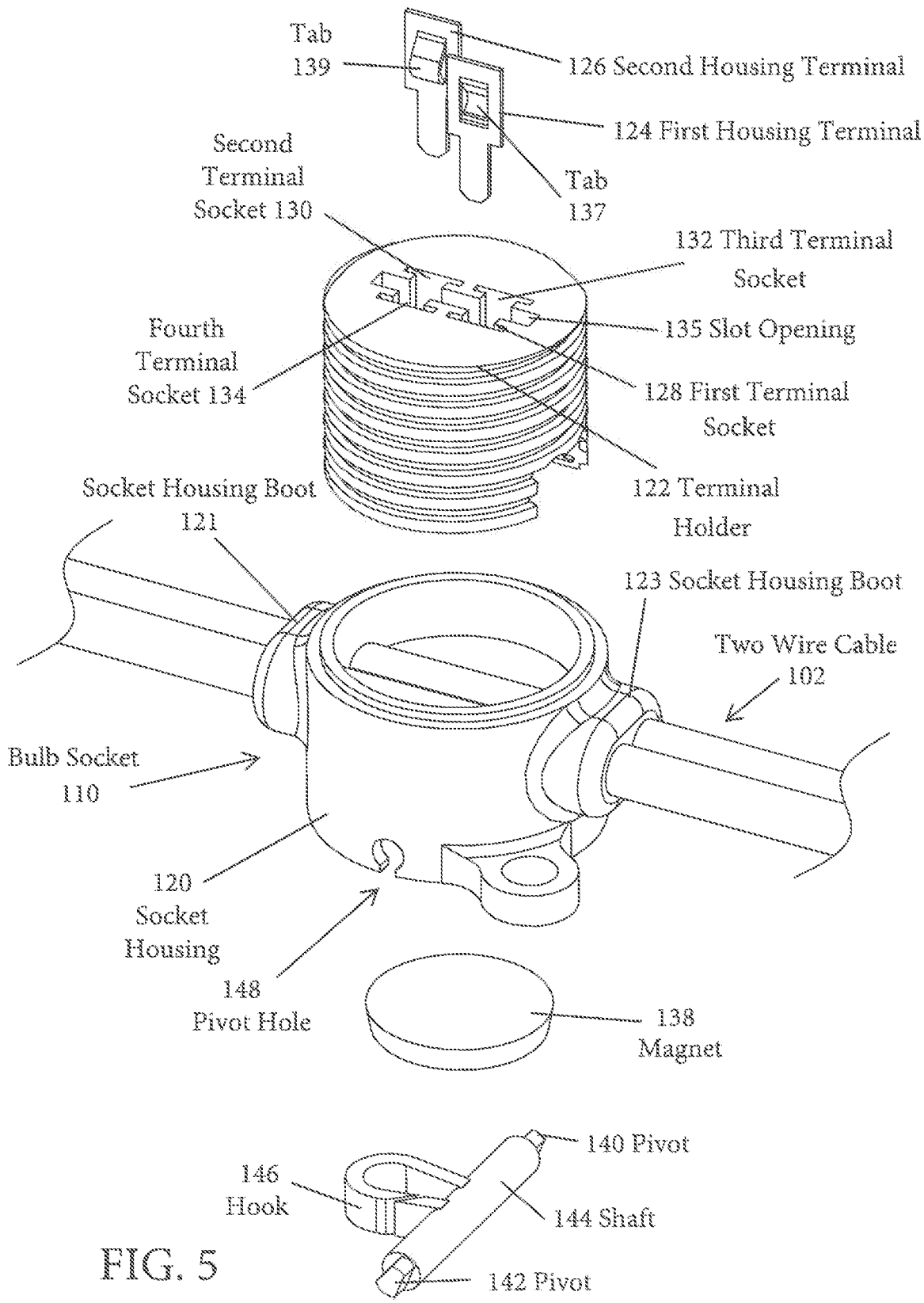
FIG. 5 is a bottom exploded view of a bulb socket.

FIG. 5 is an exploded diagram of the bulb socket 110. As illustrated in FIG. 5, two wire cable 102 passes through the socket housing 120. Socket housing boot 121 and socket housing boot 123 are secured to socket housing 120 and provide a water tight seal between said socket housing 120 and said two wire cable 102. Socket housing 120 has a pivot hole 148, which allows the pivots 140, 142 of shaft 144 to be attached to the socket housing 120. Shaft 144 has a hook 146 attached. A magnet 138 is also inserted into the socket housing 120 and secured in the manner illustrated in FIG. 6. Referring again to FIG. 5, the first housing terminal 124 and the second housing terminal 126 are attached to two separate wires of the two wire cable 102 by soldering or crimping. First housing terminal 124 has a tab 137 that elastically protrudes from said first housing terminal 124. Second housing terminal 126 has a tab 139 that elastically protrudes from said second housing terminal 126. The terminal holder 122 is then fit into the socket housing 120 so that the first housing terminal 124 fits through the first terminal socket 128 and the second housing terminal 126 fits through the second terminal socket 130. A third terminal (not shown) and a fourth terminal (not shown) can also be connected to each of the cables of the two wire cable 102 and inserted through the third terminal socket 132 and fourth terminal socket 134, respectively. Slot opening 135 is adjacent to first terminal socket 128, second terminal socket 130, third terminal socket 132 and fourth terminal socket 134 so that tabs 137, 139 protrude into slot opening 135 when the first and second housing terminals 124, 126 are inserted into the terminal sockets 128, 130, 132, 134.

Figure 6:
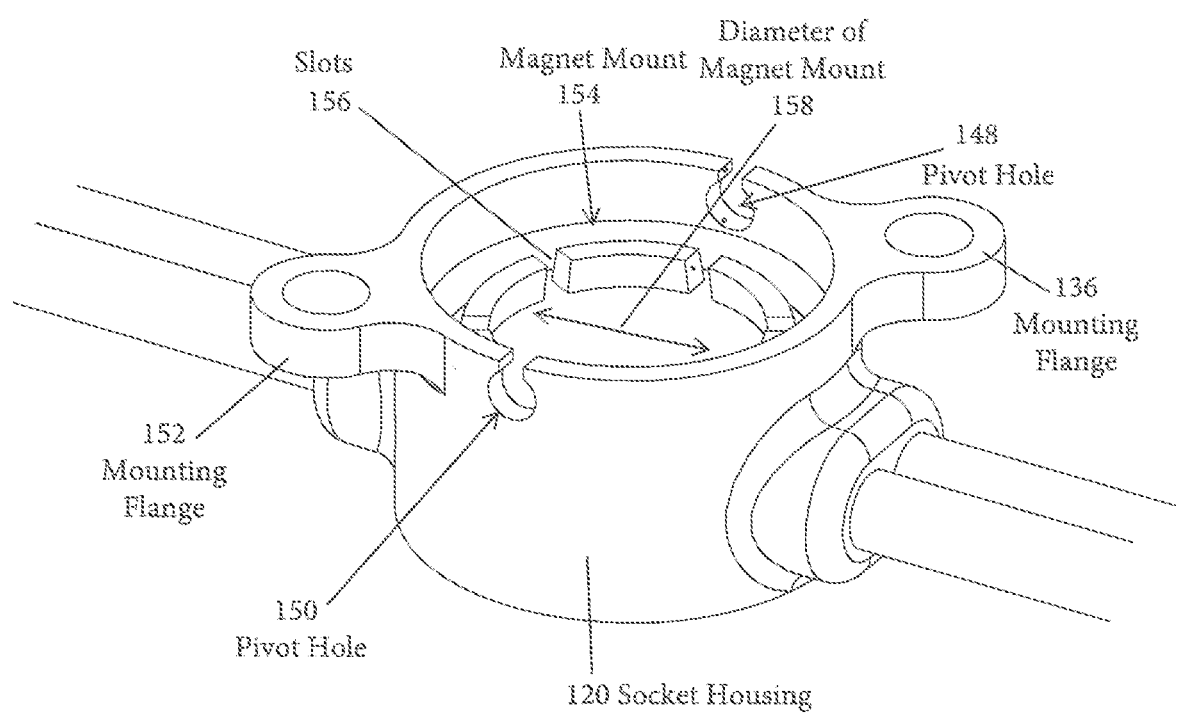
FIG. 6 is a top view of a portion of a housing.

FIG. 6 is an isometric view of the socket housing 120. The socket housing 120 has a magnet mount 154, having a plurality of slots, such as slot 156. The slots allow the magnet mount 154 to flex to accept the magnet, such as magnet 138 (FIG. 5). The magnet mount 154 has a diameter 158 that allows the magnet 138 (FIG. 5) to be mounted in the magnet mount 154. The socket housing 120 has pivot holes 148, 150 for mounting the shaft 144 and hook 146 (FIG. 5) to the socket housing 120. Socket housing 120 also has mounting flange 136 and mounting flange 152 that allows the socket housing 120 to be screwed to a base member.

Figure 7:
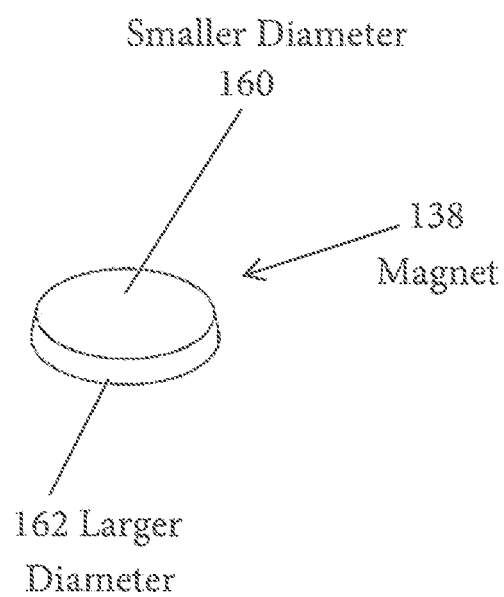
FIG. 7 is an isometric view of a magnet.

FIG. 7 is an isometric view of a magnet 138. The magnet 138 is constructed from a ferrous metal that is magnetized. The magnet 138 has a smaller diameter 160 on one surface and a larger diameter 162 on an opposite surface. The different in diameters on the surfaces of the magnet 138 assist in securing the magnet 138 to the socket housing 120.

Figures 8, 9:
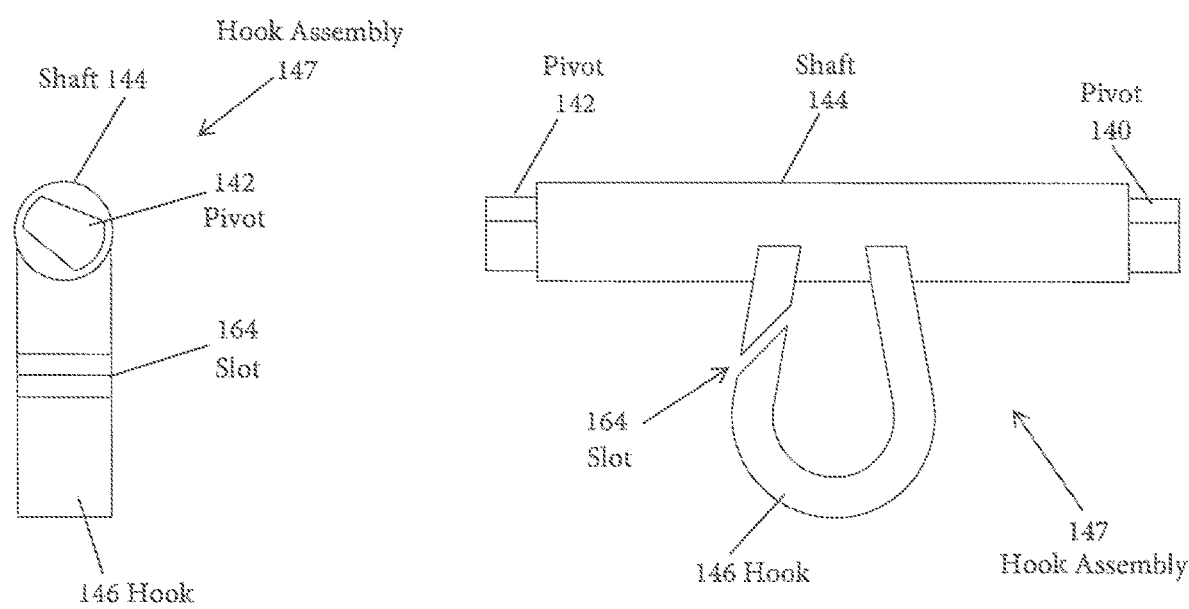
FIG. 8 is a side view of a hook and shaft.
FIG. 9 is another side view of a hook and shaft.

FIG. 8 is a side view of a hook assembly 147 that illustrates the hook 146, the slot 164 in the hook 146, the shaft 144 and pivot 142. As illustrated in FIG. 8, the pivot has an anvil shape, which allows the pivot 142 to be inserted in the pivot hole slot 149 (FIG. 10) of the pivot hole 148 (FIG. 10).

FIG. 9 is a front view of the hook assembly 147. As illustrated in FIG. 9, the hook assembly 147 includes a shaft 144 and pivots 140, 142. Hook 146 is attached to the shaft 144 and has a slot 164. The hook 146, the shaft 144 and the pivots 140, 142 are all plastic and may be molded from a single mold. Hook 146, as well as the other materials of the pivots 140, 142 and shaft 144, may be made of a material that can flex sufficiently to allow a support wire to be inserted through the slot 164 and engage the interior portion of the hook 146.

Figure 10:
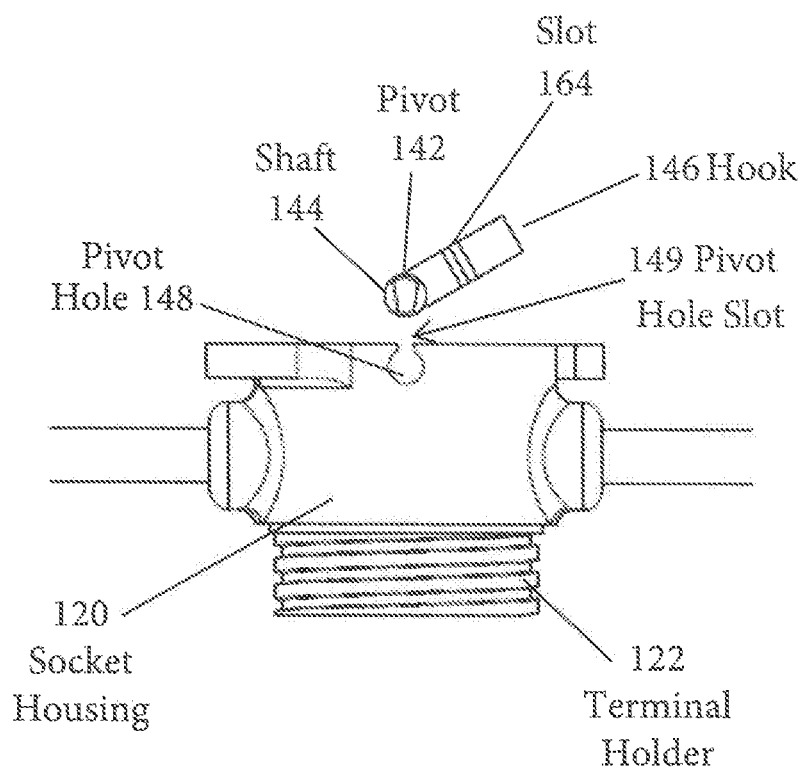
FIG. 10 is a side view of a socket housing and hook and shaft.

FIG. 10 is a side view of the socket housing 120 illustrating the manner in which the pivot 142 can be inserted through the pivot hole slot 149 and into the pivot hole 148. The pivot 142 is aligned so that the narrow portion of the pivot 142 can be inserted through the pivot hole slot 149. The shaft 144 can then be pressed downwardly, as shown in FIG. 10, so that the pivot 142 slides through the pivot hole slot 149. In that manner, the shaft 144 and the pivot 142 are secured within the pivot hole 148. FIG. 10 also illustrates the slot 164 and the hook 146, as well as the terminal holder 122.

Figure 11:
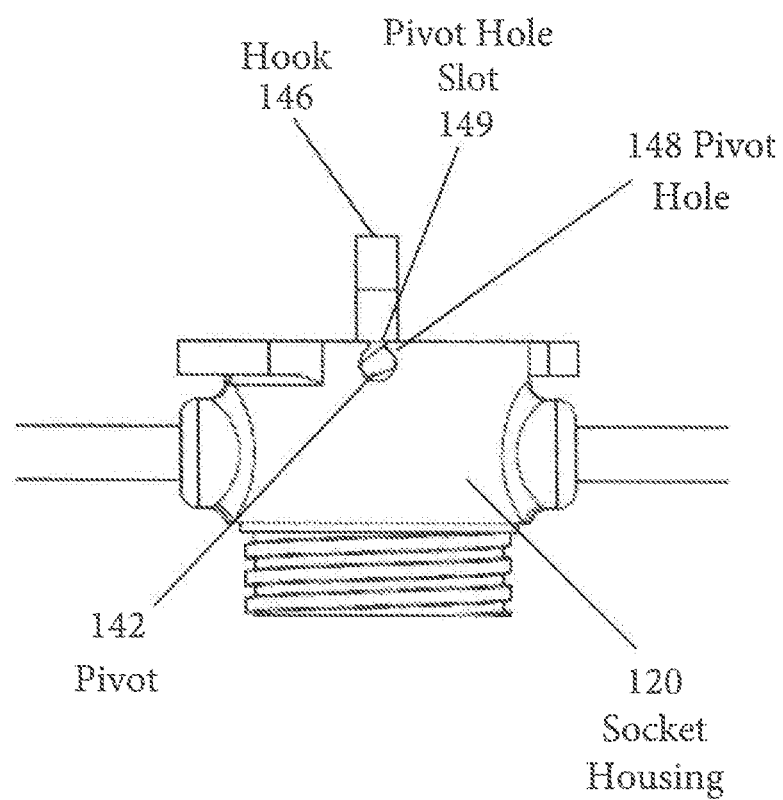
FIG. 11 is another side view of the socket housing with a hook and shaft.

FIG. 11 is a side view illustrating the pivot 142 inserted into the pivot hole 148. The hook 146 is in a vertical position, as shown in FIG. 11, so that the pivot 142 is not aligned with the pivot hole slot 149 (FIG. 10). In this manner, the socket housing 120 can be supported by the hook 146 without the pivot 142 being pulled through the pivot hole slot 149.

Figure 12:
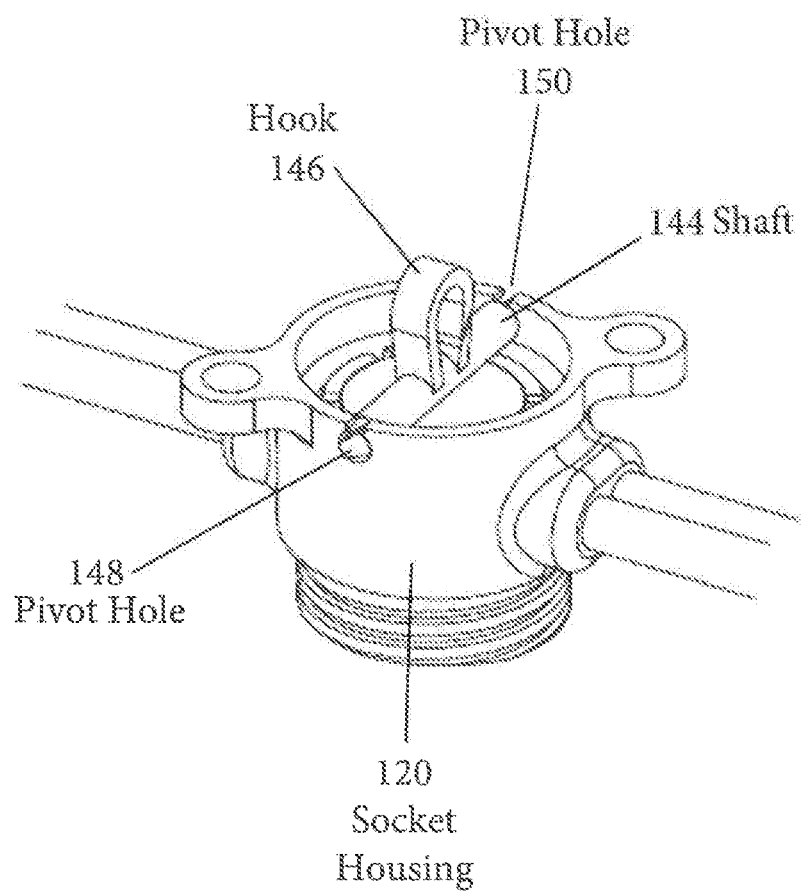
FIG. 12 is a top view of a socket housing with a hook and shaft installed in the socket housing.

FIG. 12 is an isometric view of the socket housing 120 showing the shaft 144 and pivots mounted within the pivot holes 148, 150. As illustrated in FIG. 12, the hook 146 is in a vertical position, so that the socket housing 120 can be suspended from a rope or wire.

Figure 13:
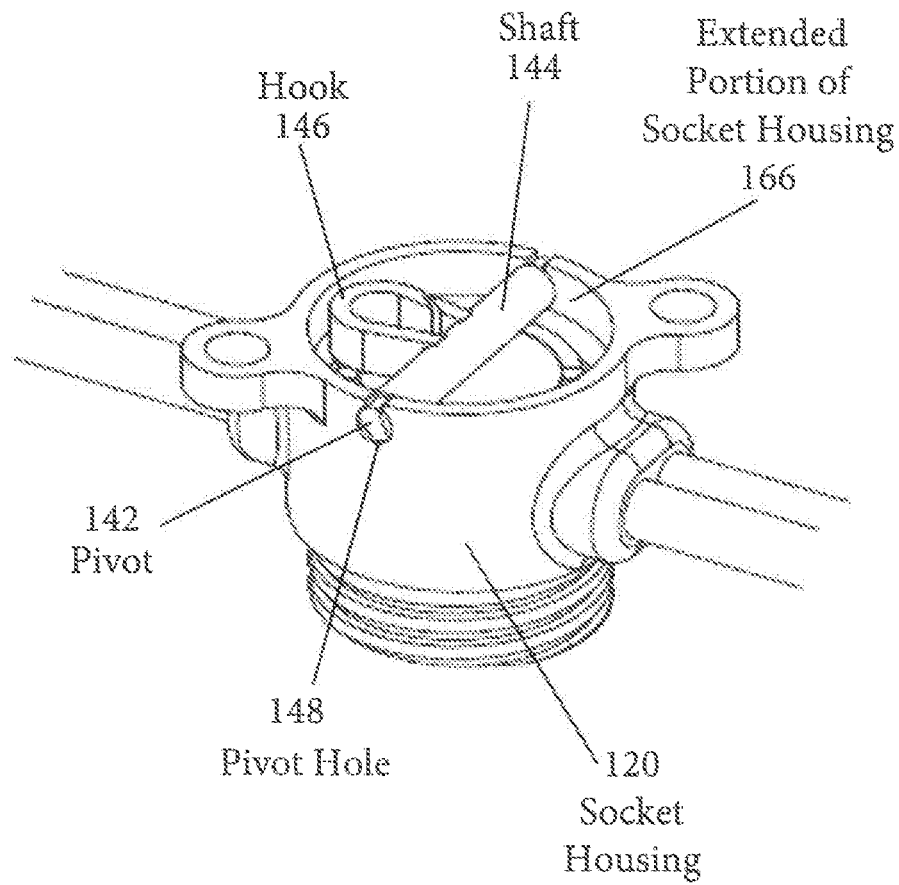
FIG. 13 is an isometric view of the socket housing with the hook pivoted into a recess position.

FIG. 13 is another isometric view of the socket housing 120 with the hook 146 pivoted into a recess in the extended portion of the socket housing 166 on the left side of the socket housing 120, as illustrated in FIG. 13. With the hook 146 rotated into the position of the extended portion of socket housing 166, as shown in FIG. 13, the pivot 142 is not aligned with the pivot hole slot 149 (FIG. 10). In this manner, the hook 146 cannot be easily removed from the socket housing 120 in the position illustrated in FIG. 13.

Figure 14:
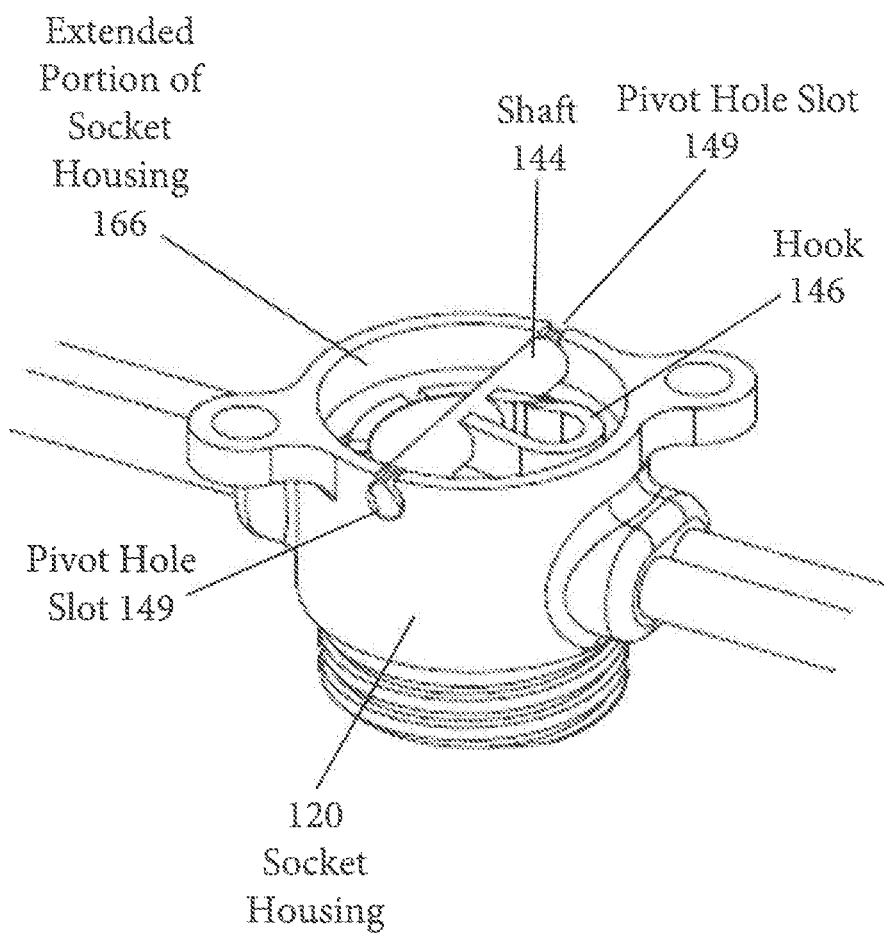
FIG. 14 is an isometric view of the socket housing with a hook pivoted into another recess position.

FIG. 14 is another schematic view of the socket housing 120 showing the hook 146 rotated and recessed into the extended portion of the socket housing 166. The shaft 144 is rotated until hook 146 is in the position illustrated in FIG. 14. As shown in FIG. 14, the pivots are not aligned with the pivot hole slot 149 so that the shaft 144 and hook 146 cannot be easily removed from the socket housing 120.

Figure 15:
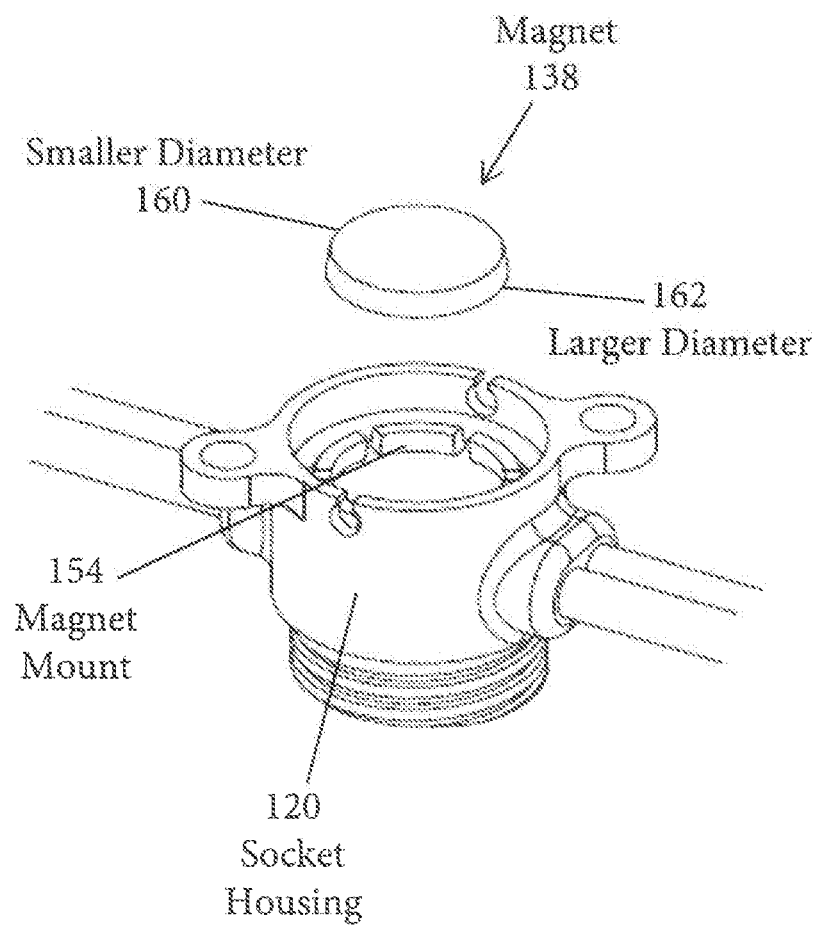
FIG. 15 is an exploded diagram of the socket housing and magnet.

FIG. 15 is another isometric view of socket housing 120 without the shaft 144 and hook 146 disposed in the socket housing 120. A magnet 138 is aligned with the magnet mount 154 (FIG. 6) and fits within the diameter of the magnet mount 158 (FIG. 6). Magnet 138 is pushed into the magnet mount 154, which flexes so that the large diameter 162 fits within the diameter of the magnet mount 158 (FIG. 6) and is held by the magnet mount 154. The smaller diameter 160 faces in an upward direction, as illustrated in FIG. 15, and has a sufficient magnetic strength to mount and hold the socket housing 120 and other portions of the light assembly to a ferrous metal support. When the shaft 144 and hook 146 are placed over the magnet 138, there is minimal interruption of the magnetic field since the shaft 144 and hook 146 are made of plastic.

Figures 16, 17:
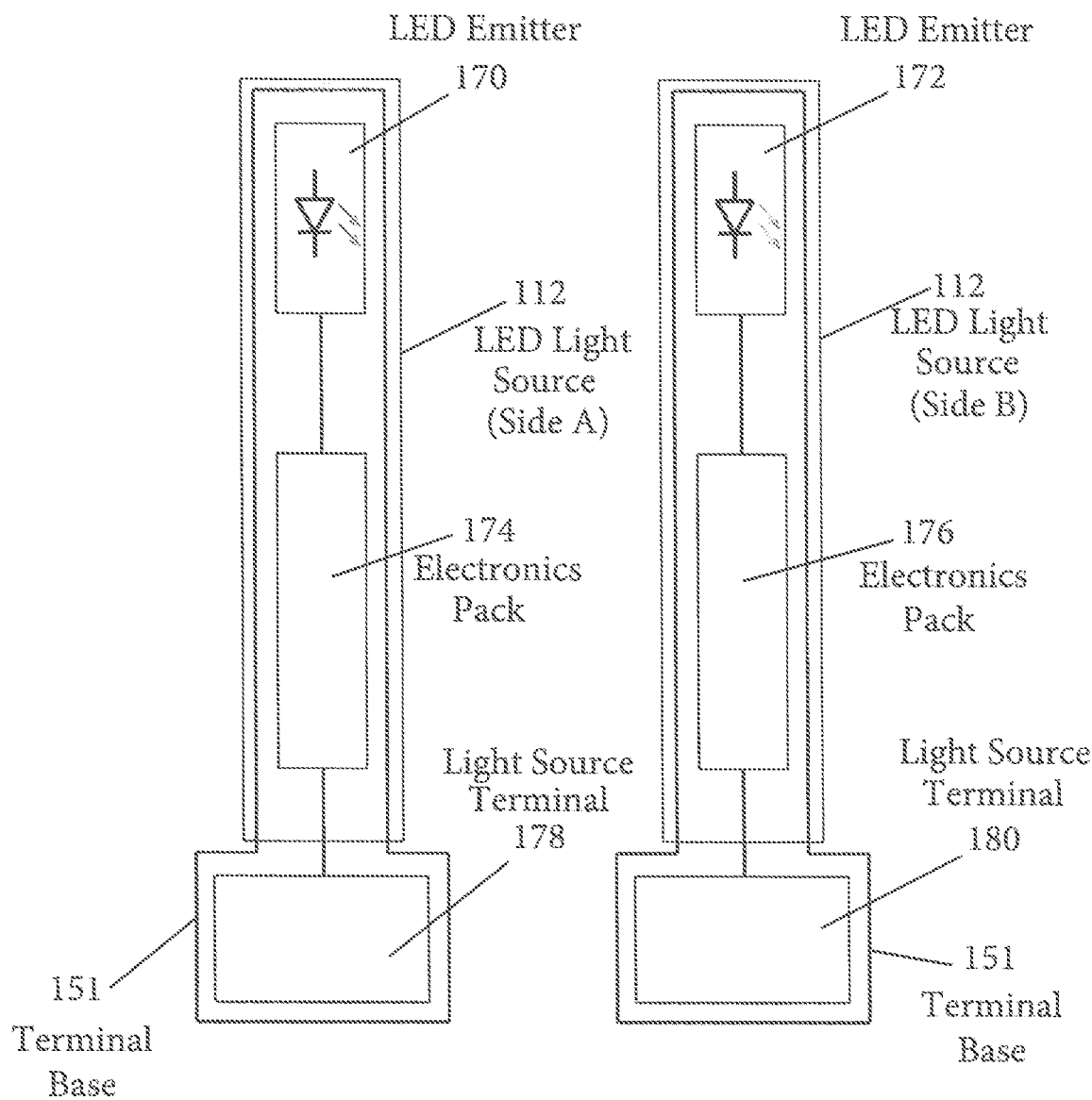
FIG. 16 is a side view of a first side (side A) of an LED light source.
FIG. 17 is a side view of a second side (side B) of an LED light source.

FIG. 16 is a side view of an LED light source terminal illustrating a first side (side A) of the LED light source 112. As illustrated in FIG. 16, the first side of LED light source 112 (side A) has one or more LED emitters 170, an electronics pack 174 and a light source terminal 178. Light source terminal 178 provides an electronic connection to the electronics pack 174 and can receive power and, in some cases, coding to control the operation of the LED emitter 170, such as disclosed in U.S. Patent application Ser. No. 62/665,360 filed May 1, 2018 by Jing Jing Yu, entitled "Individually Accessible LED Light System," which is specifically incorporated herein by reference for all that it discloses and teaches. Terminal base 151 supports light source terminal 178.

FIG. 17 is a side view of the LED light source 112, illustrating a second side (side B), which is the opposite side of side A, illustrated in FIG. 16. As illustrated in FIG. 17, side B also has a light source terminal 180, an electronics pack 176 and one or more LED emitters 172. The one or more LED emitters 170 of FIG. 16 and one or more LED emitters 172 of FIG. 17 may comprise surface mount LEDs or Chip On Board LEDs mounted on a heat dispersive substrate to provide high brightness, such as disclosed in U.S. Patent application No. 62/675,015 filed May 22, 2018 by Jing Jing Yu entitled "A Surface Mounted and Chip On Board, High Brightness LED Replaceable Lighting System," which is specifically incorporated herein by reference for all that it discloses and teaches. The light source terminal 180 is a contact for receiving power and potentially coded instructions for illuminated the LED emitter 172, such as disclosed in U.S. Patent application Ser. No. 62/665,360, referenced above. The terminal base 151 is disposed between the light source terminal 178 (FIG. 16) and light source terminal 180.

FIGS. 16 and 17 illustrate virtually identical LEDs, electronics pack and light source terminal on each side, i.e., both sides A and B. In this manner, the LED light source 112 can be plugged into the bulb socket 110 (FIG. 2) in either direction. When an AC voltage is used on two wires cable 102, such as a 117 volt RMS signal, the LEDs may illuminate each half cycle or the electronic packs 174, 176 may include an inexpensive full wave rectifier, such as disclosed in U.S. Pat. No. 9,955,538 filed by Jing Jing Yu, et al., entitled "Capacitive Full-Wave Circuit for LED Light Strings," which issued on Apr. 24, 2018; U.S. Pat. No.

8,723,432 filed by Jing Jing Yu, et al., entitled "Capacitive Full-Wave Circuit for LED Light Strings," which issued on May 13, 2014; and U.S. Pat. No. 8,314,564 filed by Jing Jing Yu, et al., entitled "Capacitive Full-Wave Circuit for LED Light Strings," which issued on Nov. 20, 2012, all of which are specifically incorporated herein by reference for all that they disclose and teach. Techniques disclosed in U.S. Pat. No. 7,518,316 filed by Jing Jing Yu, entitled "Half-Wave Rectification Circuit with a Low-Pass Filter for LED Light Strings," which issued on Apr. 14, 2009, can also be used to provide a DC signal. This patent is also specifically incorporated herein by reference for all that it discloses and teaches. Also, the wires may transmit a fully rectified signal that has been rectified by a rectifier disposed in the power plug, such as disclosed in U.S. Pat. No. 9,226,351 filed by Long Chen, et al., entitled "Compact Converter Plug for LED Light Strings," which issued on Dec. 29, 2015, which is specifically incorporated herein by reference for all that it discloses and teaches. Electrical components 134 also condition the voltage and current for driving the surface mounted, high brightness LEDs 132. In addition, the electronic packs 174, 176 condition the voltage and current for the electrical power that is passed to the next LED light emitter when the LED light string 100 is connected in series with additional LED light sources.

The electronics packs 174, 176 can include full-wave rectification, electronics, as well as smoothing devices such as capacitors and inductors, to cause the one or more LED emitters 170 and/or one or more LED emitters 172 to be lit during a full cycle of the AC signal. The electronics packs 174, 176 can be constructed in an integrated circuit, which is inexpensive compared to the cost of other components, such as the wire that is run between the bulb assemblies 108. In addition, since the electrical power signal is an AC signal, each of the LED light sources 112 creates an impedance without resistance so that if a sufficient number of the LED light sources 112 are connected in series, enough impedance can be provided in the LED light string 100, so that no resistance is required in the LED light string 100. In this manner, the efficiency of the LED light source 112 and the LED light string 100 is increased. If full-wave rectification circuits are utilized, both side A and side B can be lit on a full-time basis. The full wave rectifier doubles the light output of each of the LED emitters 170, 172 in the LED light string 100. The full wave rectification provided by the circuitry such as disclosed in U.S. Pat. Nos. 8,314,564, 8,723,432 and 9,955,538, can be implemented in each of the electronic packs, such as electronics pack 174 and electronics pack 176, in an inexpensive manner. In that way, the overall cost of the LED light string 100 is minimized and provides a significant amount of light at an inexpensive price having great reliability and longevity. Further, the LED light source 112 can be inserted in either direction and still be capable of creating a full-time source of light using the full wave rectifier circuits referenced above. The use of surface mount LEDs having high intensity or Chip On Board LEDs also increases the amount of light that can be produced by the LED emitters 170, 172. The LED light source 112 also has a terminal base 151, which is sandwiched between light source terminal 178 and light source terminal 180. The terminal base 151 fits in the slot opening 135 (FIG. 5) so that the tabs 137, 139 (FIG. 5) contact the light source terminal 178, 180.

Figure 18:
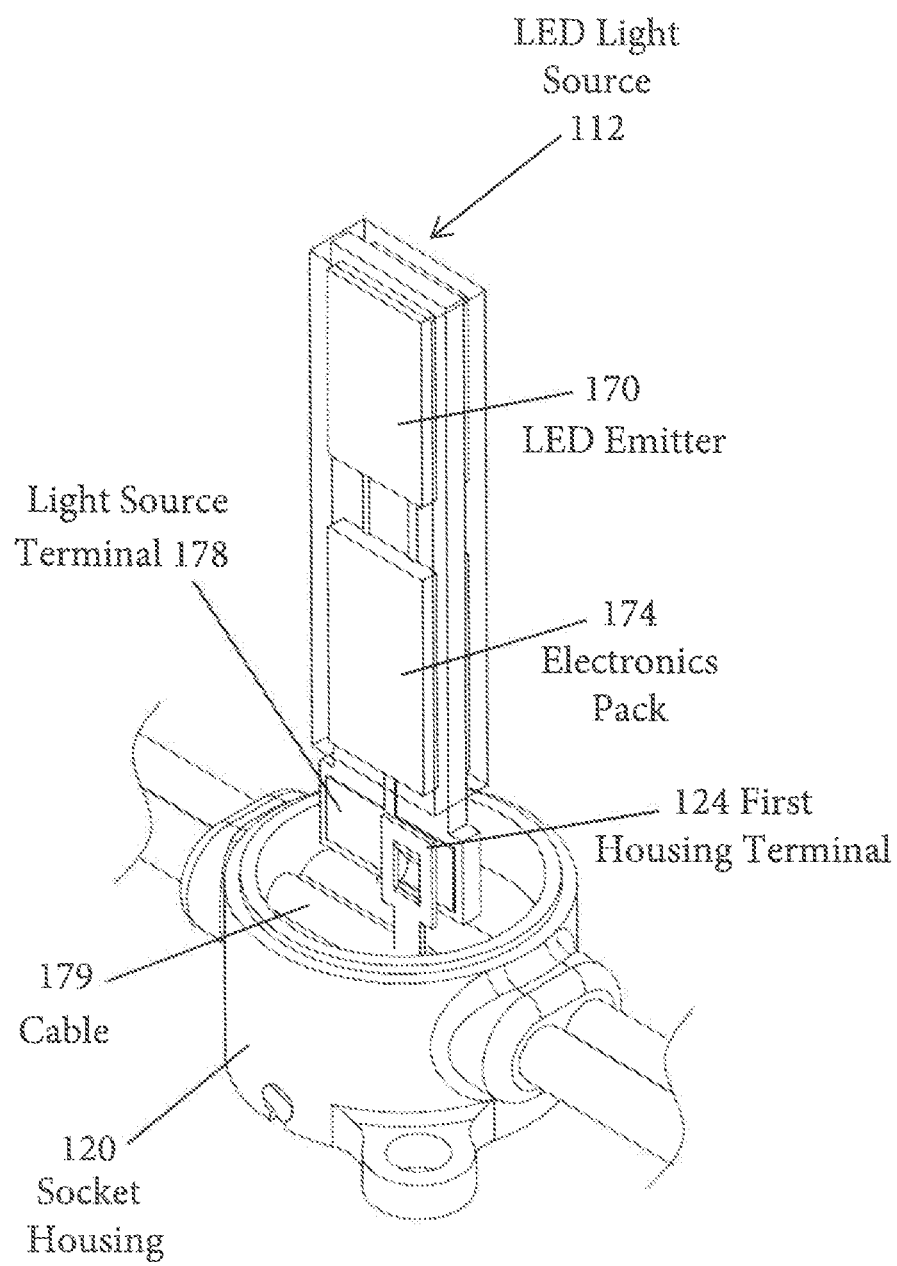
FIG. 18 is an isometric view of the first side (side A) of an LED light source that is connected to a socket housing.
Figure 19:
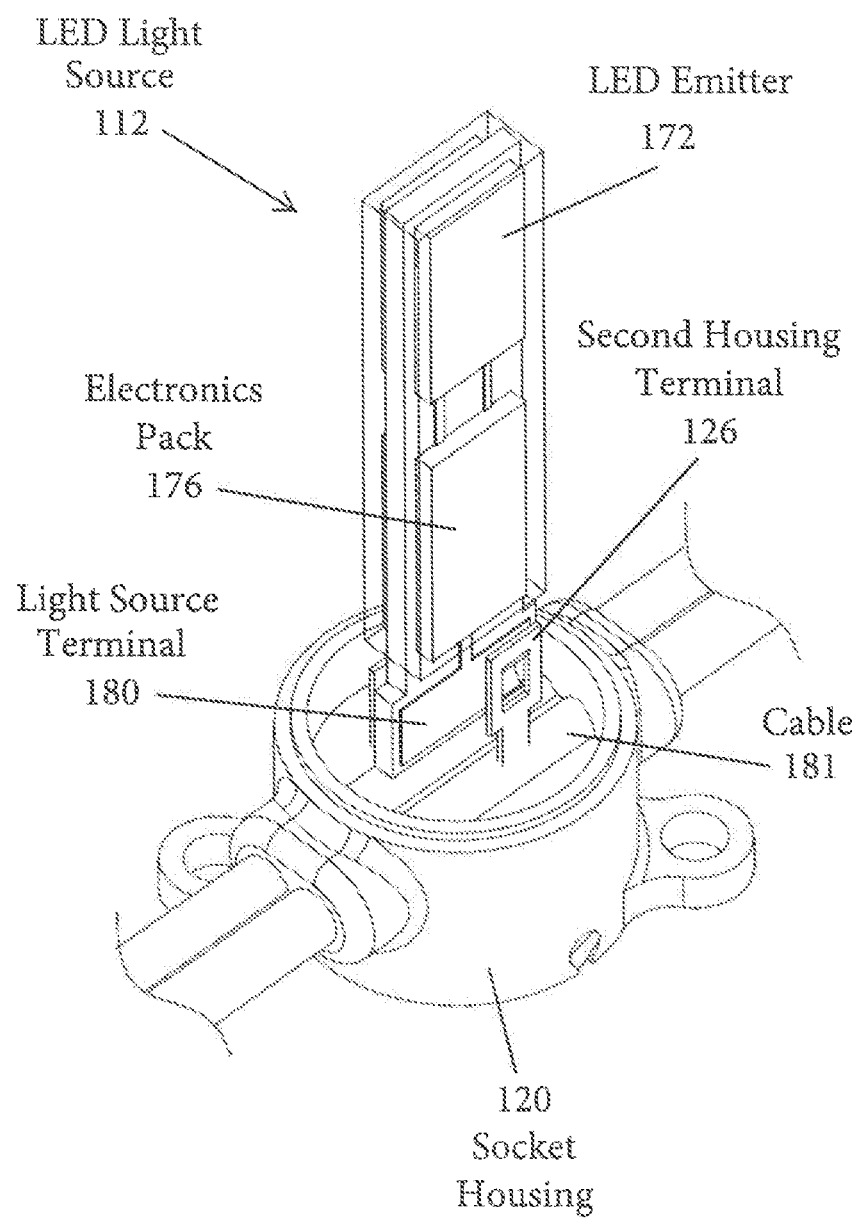
FIG. 19 is an isometric view of the second side (side B) of a light source plugged into a socket housing.

FIGS. 18 and 19 show the LED light source 112 in the socket housing 120 from two different sides. As illustrated in FIG. 18, first side (side A) of the LED light source 112 is illustrated showing LED emitter 170, electronics pack 174 and light source terminal 178. The first housing terminal 124 connects to the light source terminal 178 to provide power from cable 179 to the LED light source 112.

FIG. 19 illustrates a second side (side B) of the LED light source 112, having at least one LED emitter 172, electronics pack 176 and a light source terminal 180 that is connected to the second housing terminal 126. Second housing terminal 126 provides power to the LED light source 112 via cable 181.

Figure 20:
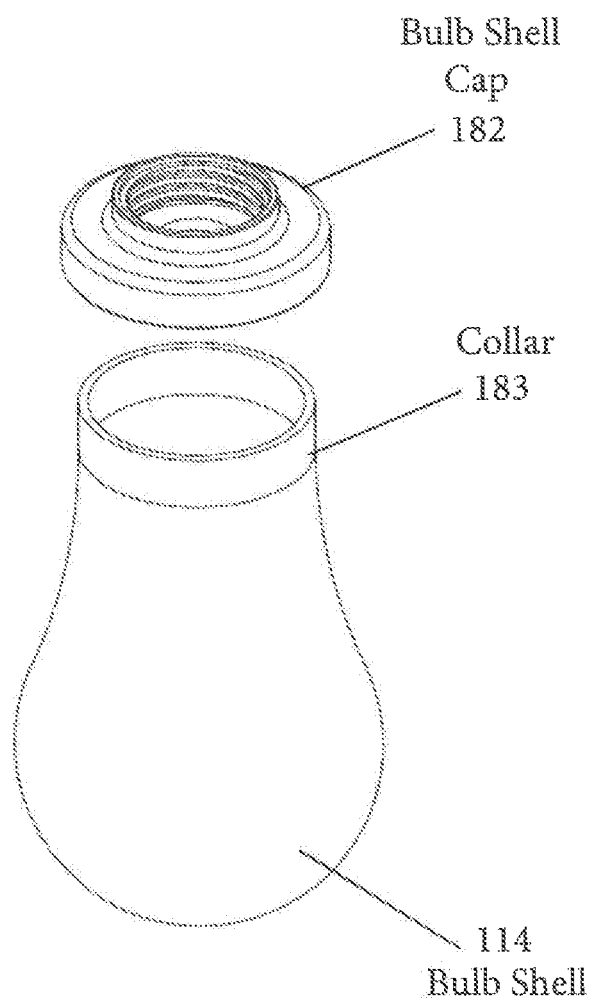
FIG. 20 is an exploded view of a bulb shell and bulb shell cap.

FIG. 20 is an isometric exploded view of a bulb shell cap 182 and bulb shell 114. The bulb shell cap 182 fits over a collar portion of the bulb shell 114. The bulb shell cap 182 may form an interference fit with the collar 183, which provides a waterproof fit between the bulb shell 182 and collar 183. Alternatively, the bulb shell cap 182 and the collar 183 can be heat welded or bonded together. Collar 183 may just form a portion of the bulb shell 114 when the bulb shell 114 is molded. Bulb shell 114 may be easily molded using blow mold techniques.

Figure 21:
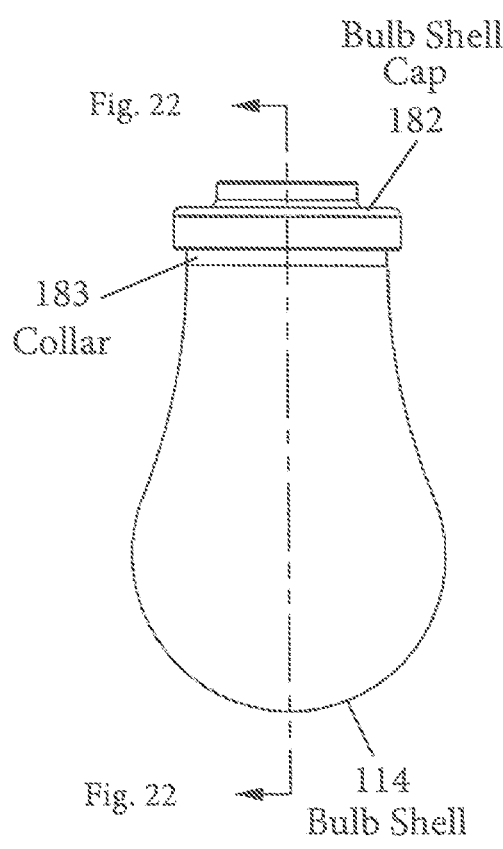
FIG. 21 is a side view of a bulb shell and bulb shell cap.

FIG. 21 is a side view of the bulb shell 114 and bulb shell cap 182 as assembled. As shown, the bulb shell cap 182 is fit onto the collar 183 using a friction or interference fit, which allows the bulb shell 114 to be removed from the bulb shell cap 182, applying hand pressure while still maintaining a waterproof fit between the bulb shell cap 182 and the bulb shell 114. Alternatively, bulb shell 114 can be bonded or welded to bulb shell cap 182.

Figure 22:
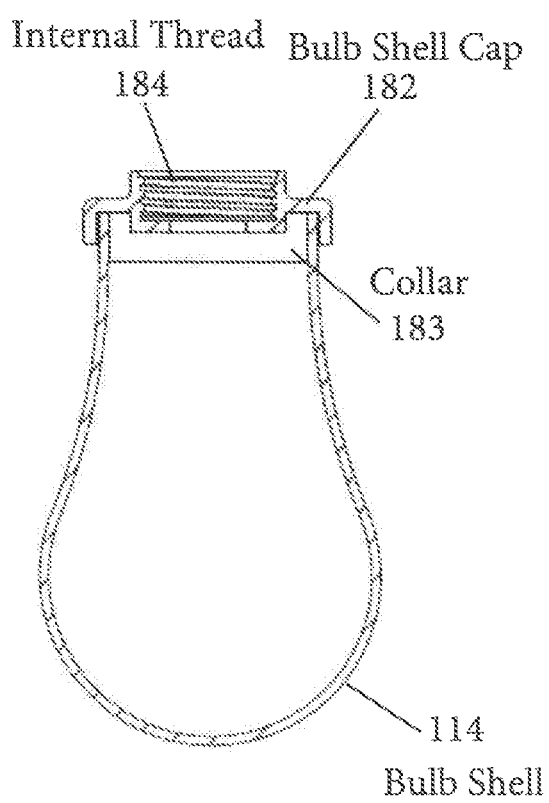
FIG. 22 is a sectional view of the bulb shell and bulb shell cap of FIG. 21.

FIG. 22 is a sectional view of FIG. 21. As illustrated in FIG. 22, the sides of the bulb shell cap 182 are fit over the collar 183 to provide a waterproof fit between the bulb shell 114 and the bulb shell cap 182. Internal threads 184 are also illustrated on the bulb shell cap 182, which engage the terminal holder 122 (FIGS. 3 and 5).

Figure 23:
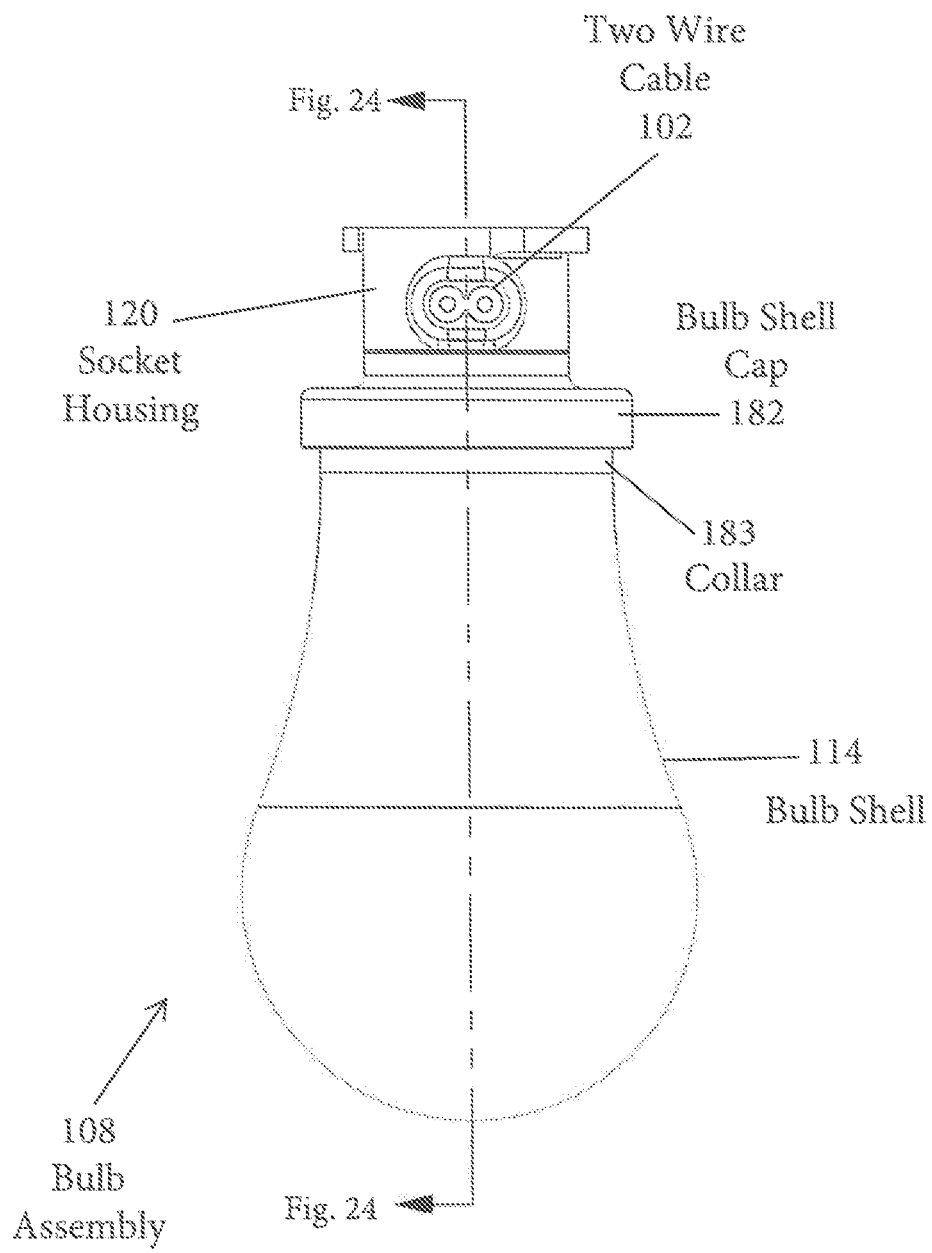
FIG. 23 is a side view of an LED light assembly of an LED light string.

FIG. 23 is a side view of the bulb assembly 108. As illustrated in FIG. 23, the bulb assembly 108 includes a bulb shell 114 having a collar 183. Collar 183 engages the bulb shell cap 182 to provide an interference fit or bonded fit that is waterproof. The bulb shell cap 182 is screwed to the socket housing 120 via terminal holder 122 (illustrated in FIG. 5). The two wire cable 102 passes through the socket housing 120.

Figure 24:
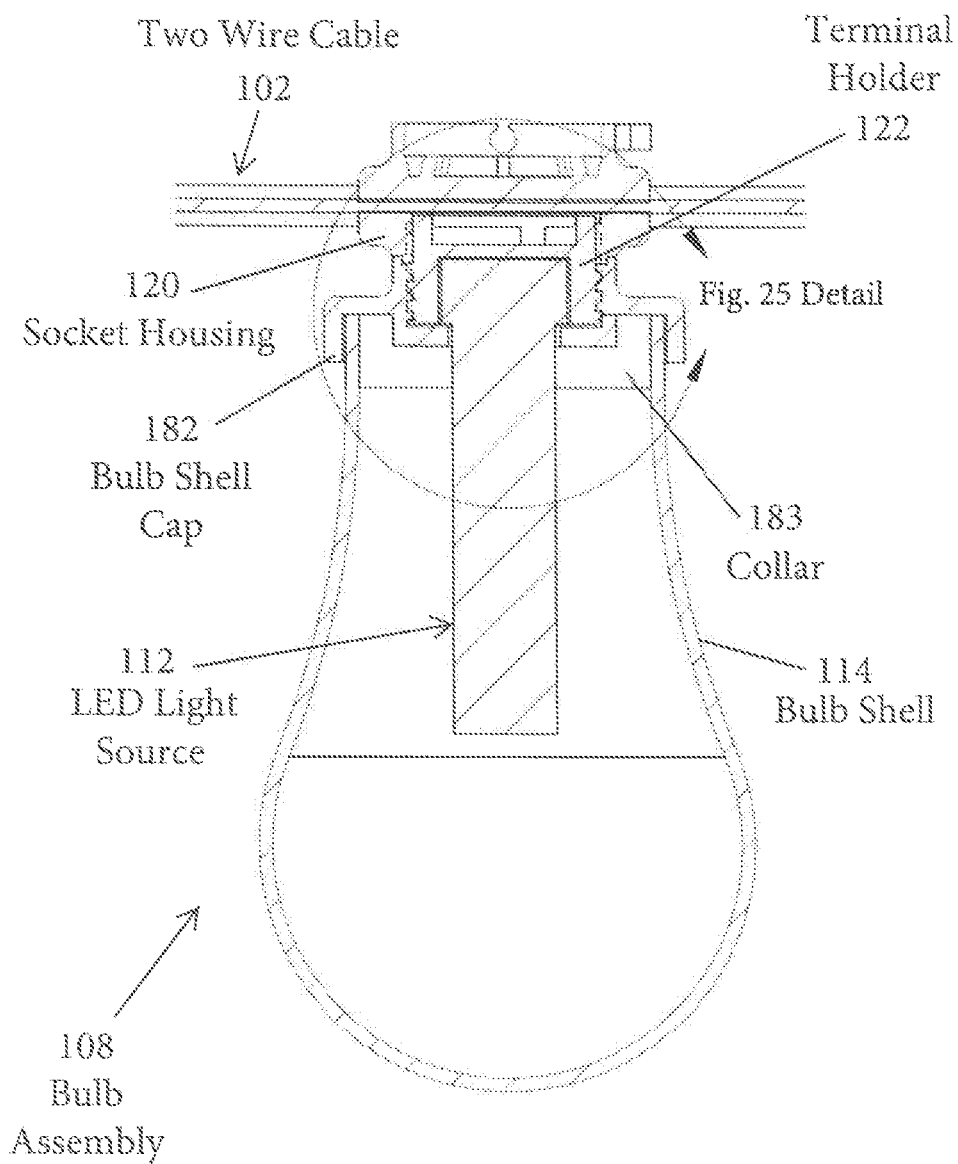
FIG. 24 is a cross-sectional view of the LED light of FIG. 23.

FIG. 24 is a cross-sectional view of a bulb assembly 108, as illustrated in FIG. 23. As illustrated in FIG. 24, the bulb assembly 108 includes a bulb shell 114 having a collar 183, which engages the bulb shell cap 182. Socket housing 120 engages the terminal holder 122, which in turn engages the bulb shell cap 182. The LED light source 112 is mounted in the terminal holder 122, as illustrated in FIG. 24. The two wire cable 102 extends through the socket housing 120.

Figure 25:
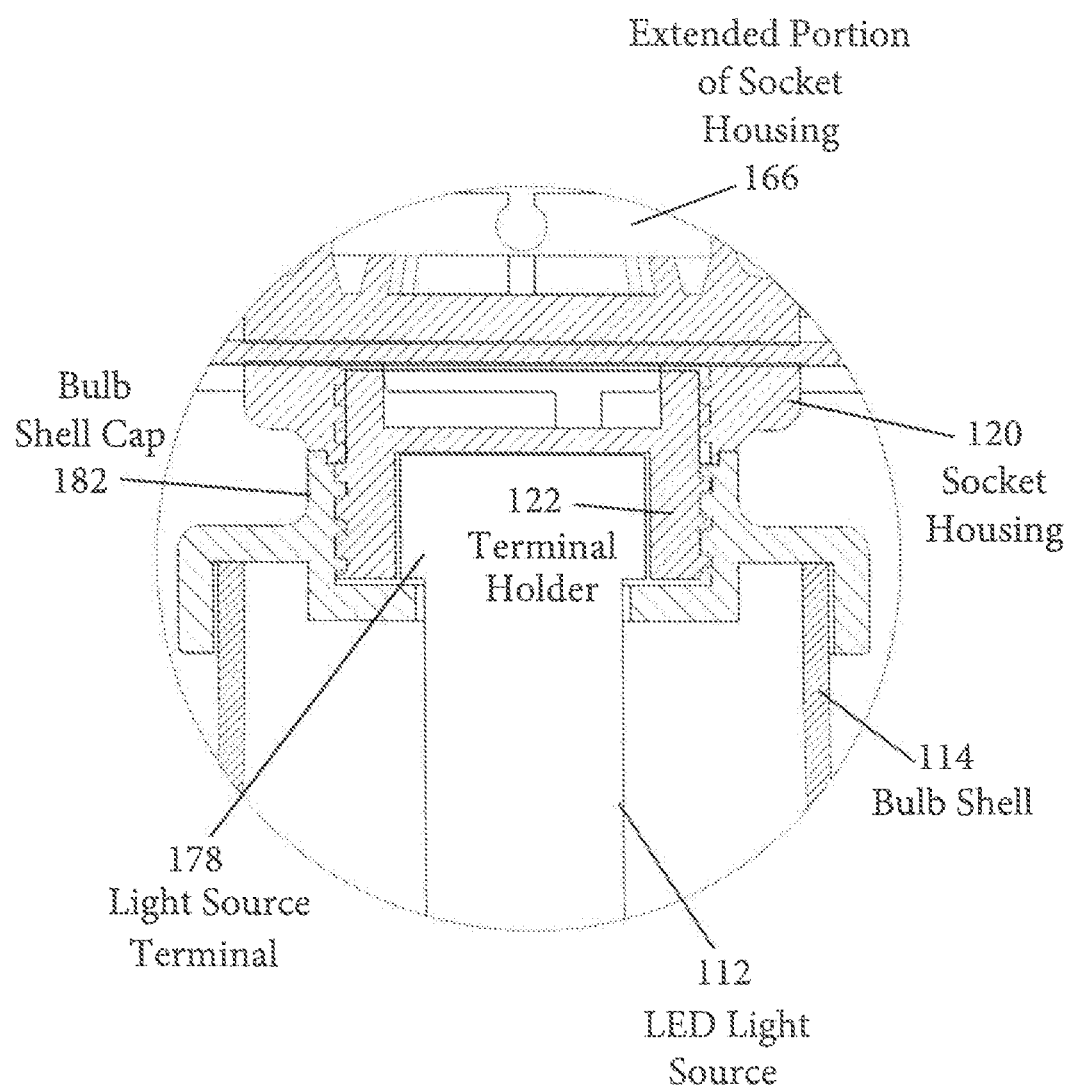
FIG. 25 is a detailed view of the section of FIG. 24.

FIG. 25 is the detailed view illustrated in FIG. 24. As illustrated in FIG. 25, the terminal holder 122 engages the bulb shell cap 182. The terminal holder 122 holds the light source terminal 178 on the LED light source 112. The terminal holder 122 is attached to the socket housing 120. The bulb shell 114 is also illustrated in FIG. 25, which is mounted to the bulb shell cap 182.

Figures 26, 27:
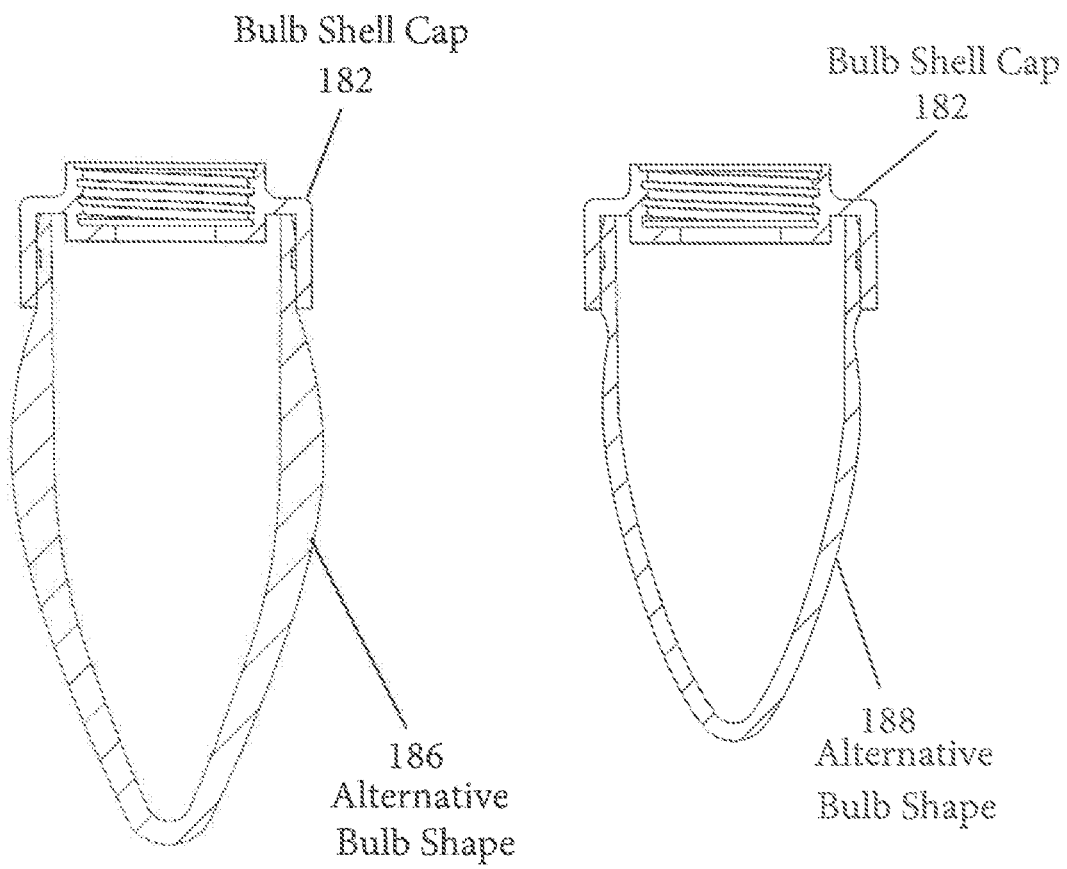
FIG. 26 is a cross-sectional view of an alternative bulb shape.
FIG. 27 is a cross-sectional view of another alternative bulb shape.

FIG. 26 is a cross-sectional view of an alternate bulb shape 186. The alternate bulb shape 186 is secured to the bulb shell cap 182. All of the different bulbs and bulb shapes can be created from a plastic material that can be blow molded or molded in other ways. The plastic of the bulb shell can be made to be clear, frosted or any desired color.

FIG. 27 shows an additional alternate bulb shape 188. The alternate bulb shape 188 is attached to the bulb shell cap 182.

Figure 28:
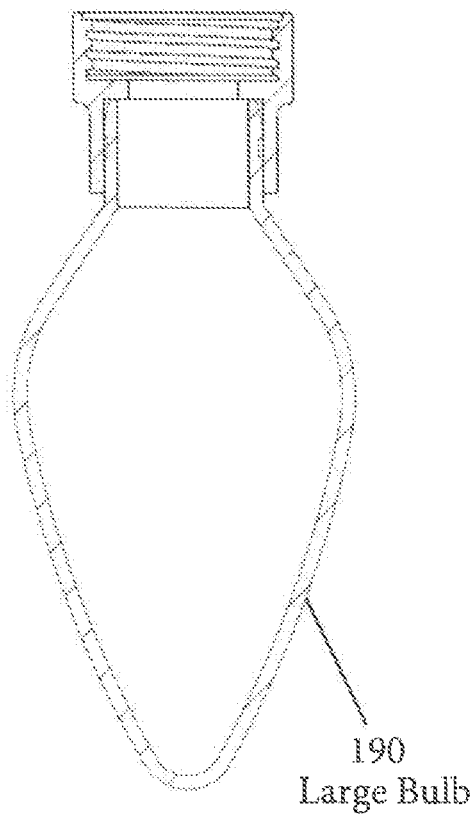
FIG. 28 is a cross-sectional view of a large bulb shape.

FIG. 28 discloses a large bulb 190 that is connected to bulb shell cap 182. The internal threads of the bulb shell cap are also illustrated.

Figure 29:
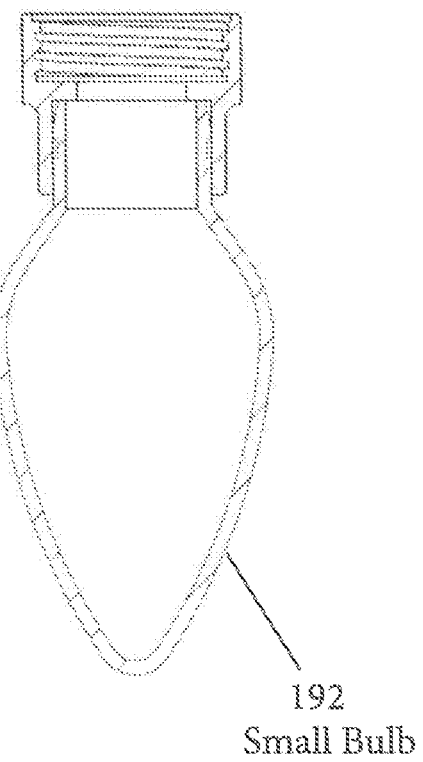
FIG. 29 is a cross-sectional view of a small bulb shape.

FIG. 29 discloses a small bulb 192 that is connected to bulb shell cap 182. The internal threads of the bulb shell cap are also illustrated.

Figure 30:
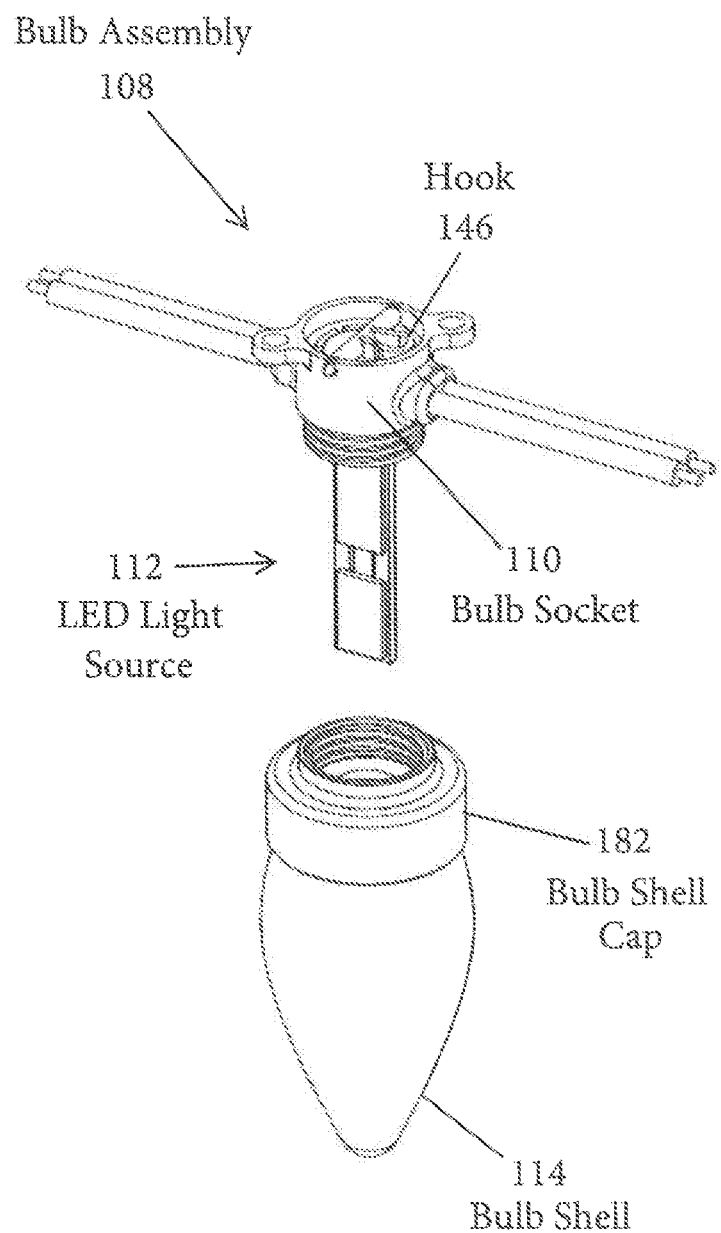
FIG. 30 is an exploded view of a single light assembly, showing a hook in a recess position.

FIG. 30 is an exploded view of the bulb assembly 108. As illustrated in FIG. 30, the LED light source 112 fits through the bulb shell cap 182 and is located within the bulb shell 114, when assembled. The LED light source 112 is connected to the bulb socket 110. Hook 146 is illustrated in a recess position in the bulb socket 110.

Figure 31:
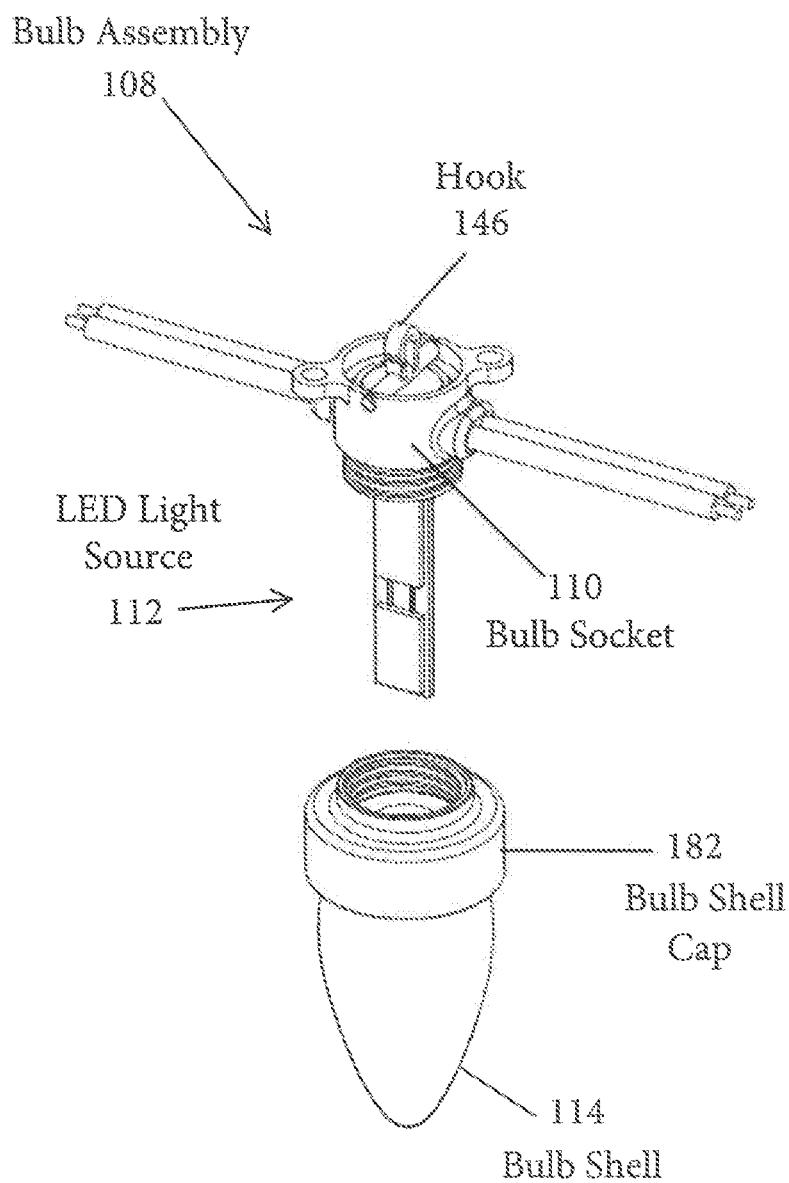
FIG. 31 is an isometric view of a single light assembly with a hook in a raised position.

FIG. 31 is another exploded view of the bulb assembly 108, showing the hook 146 disposed in an upright position within the bulb socket 110. The LED light source 112 is connected to the bulb socket 110 and extends through the opening in the bulb shell cap 182 into the bulb shell 114, when assembled.

Figure 32:
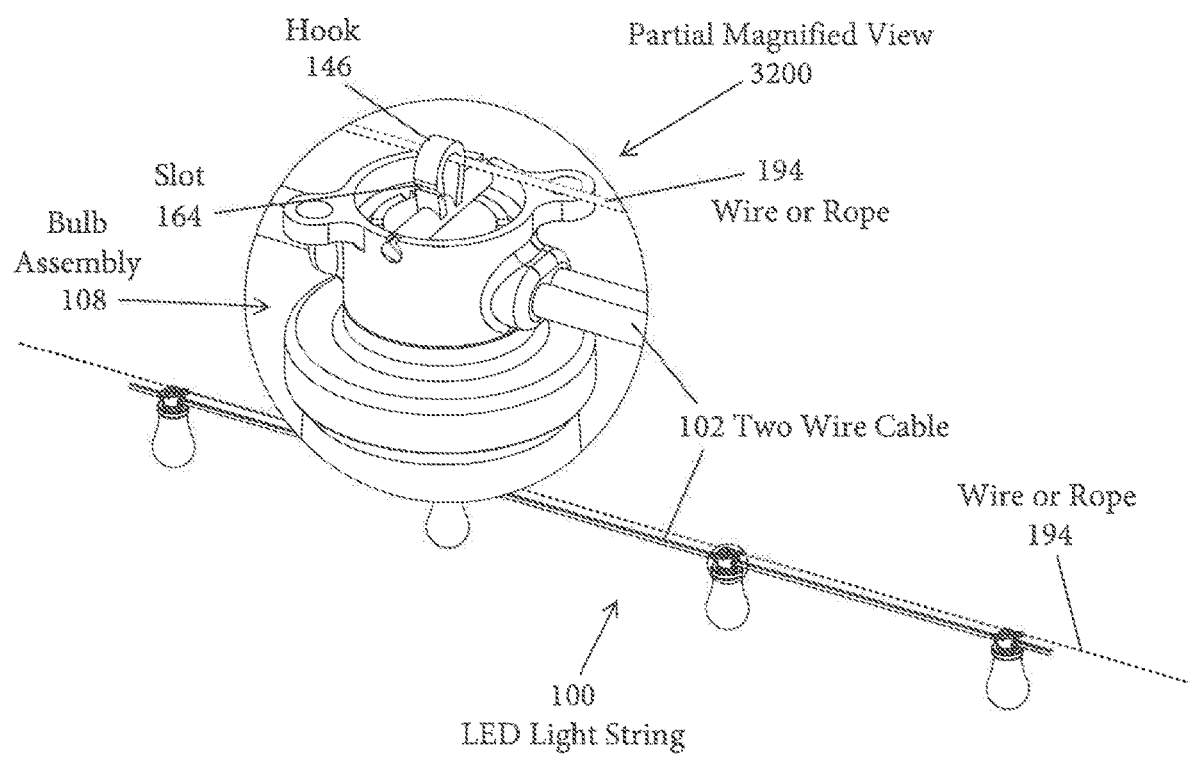
FIG. 32 is a partial magnified view illustrating the manner in which a hook is capable of suspending a light assembly on a wire or rope.

FIG. 32 is a partial magnified view 3200 of a bulb assembly, such as bulb assembly 108. As shown in FIG. 32, the two wire cable 102 passes through the bulb assembly 108. A wire or rope 194 extends along the length of the LED light string 100. The wire or rope 194 passes through the hook 146 and supports the bulb assembly 108 from the suspended wire or rope 194. The wire or rope 194 is pushed through the slot 164 on the hook 146, which is made of a material that can deflect sufficiently to allow the wire or rope 194 to pass through the slot 164. In this manner, the LED light string 100 can be suspended in a simple and easy manner from a wire or rope 194.

Figure 33:
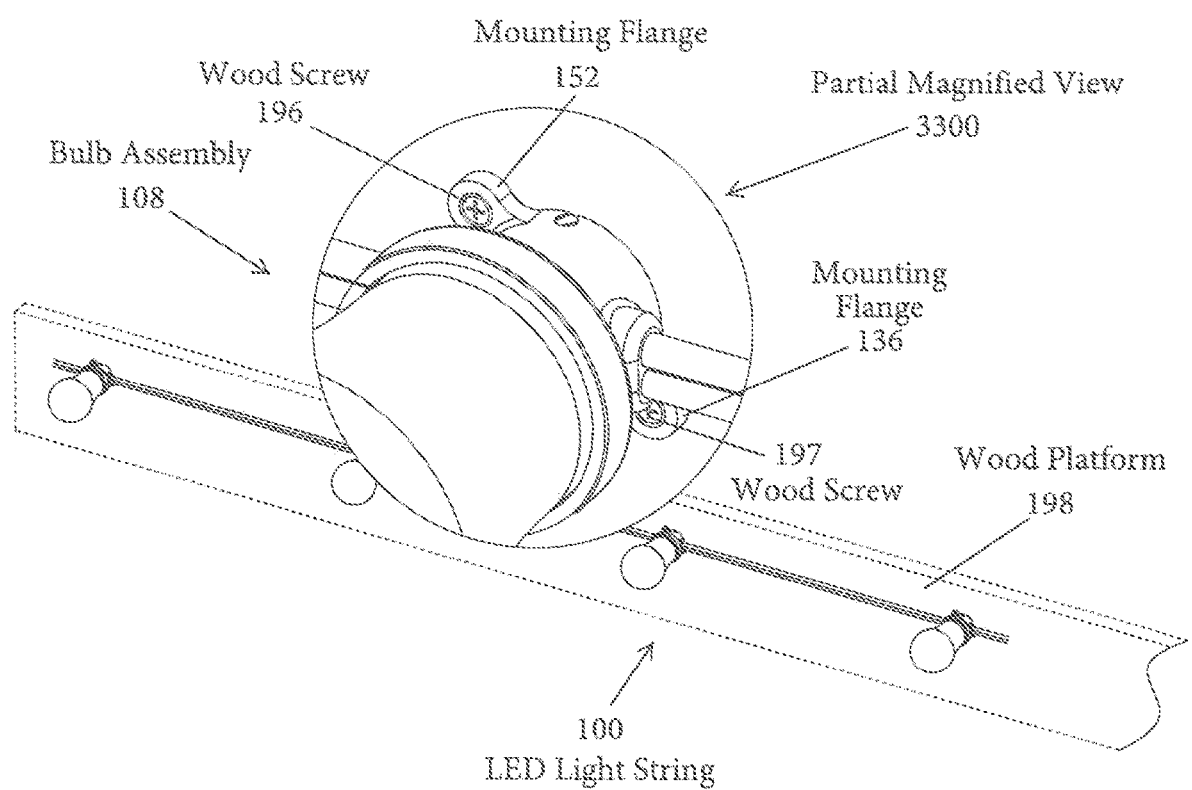
FIG. 33 is a partial magnified view illustrating the manner in which a light assembly can be screwed to a wooden platform.

FIG. 33 is a partial magnified view 3300 of a bulb assembly 108. As illustrated in FIG. 33, wood screws 196, 197 extend through mounting flanges 152, 136, respectively, and are used to mount the bulb assembly 108 to a wooden platform 198. As shown in FIG. 33, the LED light string 100 can be mounted on a wooden platform 198 in a simple and easy manner to provide outdoor lighting. In one example, the wooden platform 198 can form part of a soffit on a house.

Figure 34:
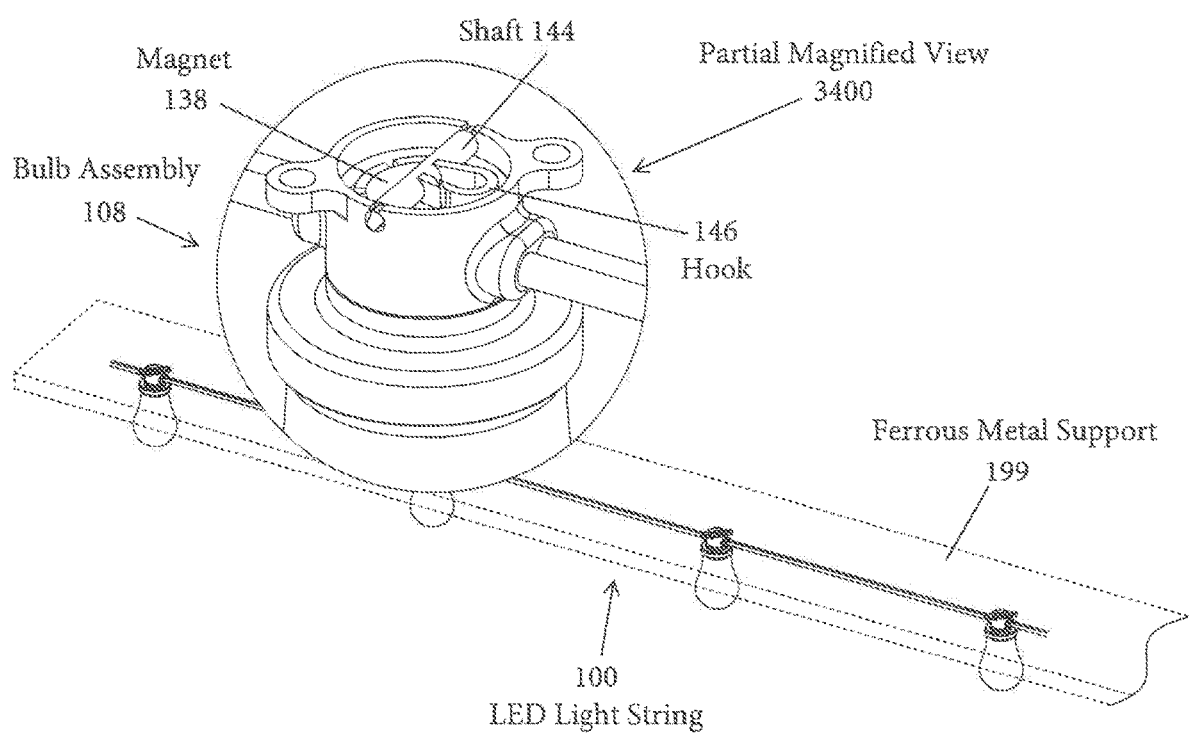
FIG. 34 is a partial magnified view of the manner in which a light assembly can be suspended from a ferrous metal support using a magnet.

FIG. 34 is a partial magnified view 3400 of a bulb assembly 108, showing the manner in which an LED light string 100 can be mounted from a ferrous metal support 199. As illustrated in FIG. 34, the shaft 144 is rotated so that the hook 146 is in a recess position. Magnet 138 is sufficiently strong to create a magnetic field that supports the bulb assembly 108 from the ferrous metal support 199.

Accordingly, the present invention provides a waterproof LED light string 100, which is constructed in a manner to minimize corrosion and provide many years of lighting in various outdoor venues. The light string utilizes plastic threads which will not corrode and allows replacement of an LED light source 112 by simply removing a bulb shell 114 from a bulb socket 110. The LED light source 112 provides a bright light source and has at least one LED mounted on each side of the LED light source 112. The LED light source 112 is constructed to be bidirectional so that the LED light source 112 can be plugged into the bulb socket 110 in either direction, thereby minimizing user error. The LED light source 112 is easily replaceable by simply removing the bulb shell 114 from the bulb socket 110 and unplugging the LED light source 112 from the bulb socket 110 and plugging a new LED light source 112 into the bulb socket 110. The LED light source 112 can be plugged in either direction into the bulb socket 110. The LED light source 112 may contain multiple high illumination LEDs on each side, using surface mount LEDs and Chip On Board LEDs, and can provide full time illumination or half time illumination on each side of the LED light source 112.

What is claimed is:

1. An LED light string for illuminating an outdoor area that is waterproof and resistant to corrosion comprising:
a pair of wires that carry an alternating current signal;
a plastic socket housing that surrounds a portion of said pair of wires;
socket housing boots made from plastic that provide a water tight seal between said pair of wires and said socket housing;
a first housing terminal that is electrically connected to a first wire of said pair of wires and having a first tab that protrudes from a surface of said first housing terminal;
a second housing terminal that is electrically connected to a second wire of said pair of wires and having a second tab that protrudes from a surface of said second housing terminal;
a plastic terminal holder that is secured to said socket housing to create a water tight seal between said terminal holder and said socket housing, said terminal holder having first openings which hold said first housing terminal and said second housing terminal securely in said terminal holder, and a second opening, adjacent to said first openings that forms a slot in said terminal holder adjacent to said first housing terminal and said second housing terminal so that said first tab on said first housing terminal and said second tab on said second housing terminal extend into said slot;
an LED light source having a first light source terminal, a first electronics pack and a first LED emitter having at least one LED, said first light source terminal, said first electronics pack and said first LED emitter located on a first side of said LED light source, and a second light source terminal, a second electronics pack and a second LED emitter having at least one LED, said second light source terminal, said second electronics pack and said second LED emitter located on a second side of said LED light source, said LED light source having a terminal base between said first light source terminal and said second light source terminal that fits in said slot in said terminal holder so that said first tab of said first housing terminal contacts said first light source terminal and said second tab on said second housing terminal contacts said second light source terminal when said terminal base is disposed in said slot in said terminal holder.

2. The LED light string of claim 1 wherein said first electronics pack and said second electronics pack having full wave rectifiers that provide power to both said first LED emitter and said second LED emitter that cause said first LED emitter or said second LED emitter to be continuously illuminated.

3. The LED light string of claim 2 further comprising:
a rotatable plastic hook that pivots in said plastic socket housing from a recessed position within said plastic socket housing to an extended position for engagement with a suspension wire.

4. The LED light string of claim 3 further comprising:
at least one plastic flange secured to said plastic socket housing having an opening for a screw to mount said plastic socket housing to a support.

5. The LED light string of claim 4 further comprising:
a magnet disposed in said plastic socket housing that creates a magnetic field that is sufficiently strong to support said plastic socket housing with a ferrous metal support.

6. The LED light string of claim 1 wherein said first LED emitter and said second LED emitter comprise multiple surface mount LEDs.

7. The LED light string of claim 1 wherein said first LED emitter and said second LED emitter comprise Chip on Board LEDs.

8. The LED light string of claim 1 further comprising:
a plastic bulb shell that surrounds said LED light source;
a plastic bulb shell cap connected to said plastic bulb shell having plastic threads that screw together with plastic threads on said plastic terminal holder to form a water tight seal between said bulb socket and said plastic bulb shell.

9. A method of making an LED light string for illuminating an outdoor area that is waterproof and resistant to corrosion comprising:
providing a molded bulb shell having a collar portion;
providing a molded bulb shell cap having a surface that fits over said collar portion of said bulb shell and forms a water tight seal;
providing a molded plastic socket housing having at least one mounting flange, pivot holes for mounting a shaft and hook for suspending said LED light string from a wire, two openings for passing an electrical cable through said socket housing, and a magnet mount for mounting a magnet;
providing a molded plastic terminal holder having plastic threads on an exterior surface and at least two terminal openings and a slot opening adjacent to said at least two terminal openings;
attaching at least two housing terminals to said electrical cable that extend through said at least two terminal openings in said plastic terminal holder;
attaching said plastic terminal holder to said plastic socket housing to form a waterproof seal between said plastic terminal holder and said plastic socket housing;
attaching said shaft and hook to said plastic socket housing;
attaching a magnet to said magnet mount in said plastic terminal holder;
providing an LED light source having duplicate circuitry comprising two LED emitters on opposite sides of said LED light source, two electronics packs on opposite sides of said LED light source that control illumination of said two LED emitters, and two light source terminals on opposite sides of said LED light source that provide power to said two electronics packs from said electrical cable allowing said LED light source to be inserted into said slot in said plastic terminal holder in either direction so that one side of said LED light source is illuminated as a result of said duplicate circuitry.

10. The method of claim 9 wherein said process of providing an LED light source comprises providing two LED emitters that comprise a plurality of surface mount LEDs.

11. The method of claim 9 wherein said process of providing an LED light source comprises providing two LED emitters that comprise a plurality of Chip on Board LEDs.

12. The method of claim 9 further comprising:
attaching socket housing boots to said electrical cable and said plastic socket housing to provide a water tight seal between said plastic socket housing and said electrical cable.

* * * * *